(12) United States Patent
Böhler et al.

(10) Patent No.: US 11,630,136 B2
(45) Date of Patent: Apr. 18, 2023

(54) PRIMARY MEASURING DEVICE FOR MEASURING A CURRENT EFFECTIVE POWER

(71) Applicant: BRUSA Elektronik AG, Sennwald (CH)

(72) Inventors: Lukas Böhler, Wangs (CH); Marc Bosch, Sennwald (CH)

(73) Assignee: BRUSA Elektronik AG, Sennwald (CH)

( * ) Notice: Subject to any disclaimer, the term of this patent is extended or adjusted under 35 U.S.C. 154(b) by 0 days.

(21) Appl. No.: 17/253,014

(22) PCT Filed: Jun. 24, 2019

(86) PCT No.: PCT/EP2019/066655
§ 371 (c)(1),
(2) Date: Dec. 16, 2020

(87) PCT Pub. No.: WO2020/002223
PCT Pub. Date: Jan. 2, 2020

(65) Prior Publication Data
US 2021/0116484 A1    Apr. 22, 2021

(30) Foreign Application Priority Data
Jun. 29, 2018 (DE) ............... 10 2018 115 887.4

(51) Int. Cl.
*G01R 21/00* (2006.01)
*H02J 50/12* (2016.01)
(Continued)

(52) U.S. Cl.
CPC ....... *G01R 21/002* (2013.01); *G01R 21/1331* (2013.01); *H02J 7/02* (2013.01); *H02J 50/12* (2016.02); *H02J 2310/48* (2020.01)

(58) Field of Classification Search
CPC ............... G01R 21/1331; H02J 50/12
See application file for complete search history.

(56) References Cited

U.S. PATENT DOCUMENTS 9,919,610 B1 * 3/2018 Sarwat ................ B60L 53/12
2013/0080093 A1   3/2013 Yang et al.
(Continued)

FOREIGN PATENT DOCUMENTS

DE          3429150 A1    2/1986
DE      102015011285 A1    3/2017
(Continued)

OTHER PUBLICATIONS

Zupinski, I, et al., "Power Factor Calibrator", Precision Electromagnetic Measurements Digest, 1996 Conference on, IEEE, Jun. 17, 1996, pp. 554-555.
(Continued)

*Primary Examiner* — Raymond L Nimox
(74) *Attorney, Agent, or Firm* — Hoffmann & Baron, LLP

(57) ABSTRACT

A measuring device for measuring current effective power in a circuit of a transmission system, including an evaluation device and a calibration device, the evaluation device having a connection for measuring current, voltage, and phase shift between the current and the voltage in the circuit, wherein the evaluation device and the calibration device are connected to one another, the evaluation device configured to measure power by evaluating measured current and measured voltage, the calibration device configured to correct the measured current and/or the measured voltage via a cos ( ) value of a measured phase shift between the measured current and the measured voltage and/or via a holding time, the evaluation device configured to calculate a power value with a corrected value of the measured current and/or a corrected value of the measured voltage, and the calibration
(Continued)

device configured to make available the calculated power as the current effective power.

9 Claims, 5 Drawing Sheets

(51) Int. Cl.
*G01R 21/133* (2006.01)
*H02J 7/02* (2016.01)

(56) References Cited

U.S. PATENT DOCUMENTS

| | | | | |
|---|---|---|---|---|
| 2015/0051750 | A1* | 2/2015 | Kurs | H02J 50/50 700/298 |
| 2015/0061636 | A1 | 3/2015 | Tsai et al. | |
| 2016/0084894 | A1* | 3/2016 | Govindaraj | H04B 5/0037 327/236 |
| 2018/0159360 | A1 | 6/2018 | Enthaler et al. | |
| 2018/0251035 | A1 | 9/2018 | Baumer et al. | |
| 2020/0290467 | A1* | 9/2020 | Gao | H02J 7/02 |

FOREIGN PATENT DOCUMENTS

| | | |
|---|---|---|
| DE | 102016224295 A1 | 6/2018 |
| EP | 0899864 A1 | 3/1999 |
| EP | 2397864 A1 | 12/2011 |
| EP | 2437573 A1 | 4/2012 |
| EP | 2868516 A1 | 5/2015 |
| EP | 3103674 A1 | 12/2016 |
| JP | 3-108674 A | 5/1991 |
| JP | 2016-86472 A | 5/2016 |
| RU | 519 U1 | 6/1995 |
| WO | WO 03/060540 A1 | 7/2003 |
| WO | WO 2009/007237 A1 | 1/2009 |
| WO | WO 2017/025131 A1 | 2/2017 |

OTHER PUBLICATIONS

"IEEE Master Test Guide for Electrical Measurements in Power Circuits", ANSI/IEEE Std. 120-1989, IEEE Standard, IEEE, Piscataway, NJ, US, Jan. 1, 1989.

English-language translation of International Preliminary Report on Patentability issued in International Application No. PCT/EP2019/066655 dated Jan. 7, 2021.

\* cited by examiner

PRIMARY MEASURING DEVICE FOR MEASURING A CURRENT EFFECTIVE POWER

CROSS-REFERENCE TO RELATED APPLICATIONS

The present application is the U.S. National Phase of PCT/EP2019/066655, filed on Jun. 24, 2019, which claims priority to German Patent Application No. 10 2018 115 887.4, filed on Jun. 29, 2018, the entire contents of which are incorporated herein by reference.

BACKGROUND

Field

The invention relates to the technical field of inductive charging. In particular, the present invention relates to a primary measuring device and a method for calibrating a measured value.

Related Art

A system for inductive power transmission can be used to electrically charge a purely electric vehicle (EV, electric vehicle) or a hybrid vehicle (PHEV, plug-in hybrid-electric vehicle) that is operated with a combination of fuel and electrical power, if charging should be done in a contactless manner. In such a system, an alternating magnetic field is generated in the frequency range of 25 kHz-150 kHz. It must be noted that outside this frequency band, the limit values for the emission of electromagnetic waves are specified by internationally applicable standards. Although a magnetic field is used in principle for power transmission, it is inherently an electromagnetic wave due to the fact that the magnetic field changes. However, because of the slow changes in the field strengths, the electromagnetic wave used in inductive charging has a wavelength of several kilometers.

In order to comply with these limit values for emissions, it must be ensured that the alternating magnetic field used for power transmission works with a fundamental resonance in the range of 25 kHz-150 kHz and contains only very low harmonics. Therefore, filters are used that remove disruptive harmonics as much as possible. In addition, in order to comply with the internationally applicable standards and guidelines, it must be ensured that a power transmission only takes place when a specific quality of the coupling to one another is achieved by adjusting a specific alignment of the coupling elements to one another, for example, by a positioning system such as described in document EP 3 103 674 A1.

Document EP 2 868 516 A1 describes a method for regulating the power transmitted between two resonators of a system for contactless power transmission, as well as a resonance arrangement.

As a coupling element, a GPM (ground pad module) is used with a primary coil for the power transmission on the stationary side and a CPM (car pad module) is used with a secondary coil on the vehicle side. The GPM and the CPM form a transformer for coupling and for the power transmission. The physical alignment of the coupling elements to one another is measured and adjusted via a positioning signal, for example, RKS (remote keyless entry system). Different transmission links and different transmission technologies are used for the power transmission and the transmission of the positioning signal.

SUMMARY

It may be seen as an object of the present invention to allow an effective transmission of energy.

Accordingly, a primary measuring device and a method for calibrating a measured value are specified.

The subject matter of the invention is indicated by the features of the independent claims. Embodiments and further aspects of the invention are given from the dependent claims and the following description.

According to one aspect of the present invention, a primary measuring device for measuring a current effective power in a primary circuit of an power transmission system is described, having an evaluation device and a calibration device, the evaluation device having a measuring connection for detecting a current, a voltage and a measured phase shift between current and voltage in the primary circuit. The evaluation device and the calibration device are connected to one another and the evaluation device is also set up to carry out a power measurement by evaluating the detected current and the detected voltage. The calibration device is set up to correct the detected current and/or the detected voltage via the cos ( ) value of the detected phase shift between the detected current and the detected voltage and/or via a holding time. The evaluation device is also set up to calculate a power value with the corrected value $I_{korr}$ of the detected current and/or with the corrected value $U_{korr}$ of the detected voltage. The calibration device is also set up to provide the calculated power value as the current effective power.

According to another aspect of the present invention, a method for determining a calibration factor for a measurement of an active power in a primary circuit of a power transmission system is specified. This method includes setting a predefinable operating point by setting a predefinable input voltage and a predefinable operating frequency, generating a power ratio at this operating point with a low effective power and a high apparent power, and determining the calibration factor as a phase shift and/or as a holding time to the known reference.

Furthermore, according to one aspect, a method for calibrating a measured value is specified. The method includes the detection of a current, a voltage and a measured phase shift between current and voltage in a primary circuit. The method also includes performing a power measurement by evaluating the detected current and the detected voltage, correcting the detected current and/or the detected voltage using the cos ( ) value of the detected phase shift between the detected current and the detected voltage and/or via a holding time. Furthermore, the method has the calculation of a power value with the corrected value of the detected current and/or the corrected value of the detected voltage and the provision of the calculated power value as the current effective power.

According to a further aspect of the present invention, a computer-readable storage medium is specified which stores a program which when it is executed by a processor, executes one of the methods according to the invention.

A control device or a controller can use such a processor.

A floppy disk, a hard disk, a USB (universal serial bus) storage device, a RAM (random access memory), a ROM (read only memory) or an EPROM (erasable programmable read only memory) may be used as a computer-readable storage medium. An ASIC (application-specific integrated circuit) or an FPGA (field-programmable gate array), as well as an SSD (solid-state drive) technology or a flash-based storage medium may also be used as storage media. A web server or a cloud can also be used as a storage medium. A communication network, such as the Internet, for example, which may allow program code to be downloaded, can also be viewed as a computer-readable storage medium. A radio-based network technology and/or a wired network technology can be used.

Furthermore, a program element is specified which, when it is executed by a processor, executes one of the methods according to the invention.

According to another aspect of the present invention, the corrected value of the detected current is obtained from the detected value of the current, taking into account a delay value which has been derived from the detected phase shift.

According to another aspect of the present invention, the calibration is carried out for a setpoint value provided by a power control.

According to yet another aspect of the present invention, the primary measuring device has a sample-and-hold device, the sample-and-hold device being set up to take into account the delay value. For example, the sample-and-hold device is set up to take into account a running time in the hardware of the primary measuring device.

According to another aspect of the present invention, a ground pad module with a primary measuring device is specified.

BRIEF DESCRIPTION OF THE DRAWINGS

In the following, further embodiments of the present invention are described with reference to the drawings.

DETAILED DESCRIPTION

Figure 1:
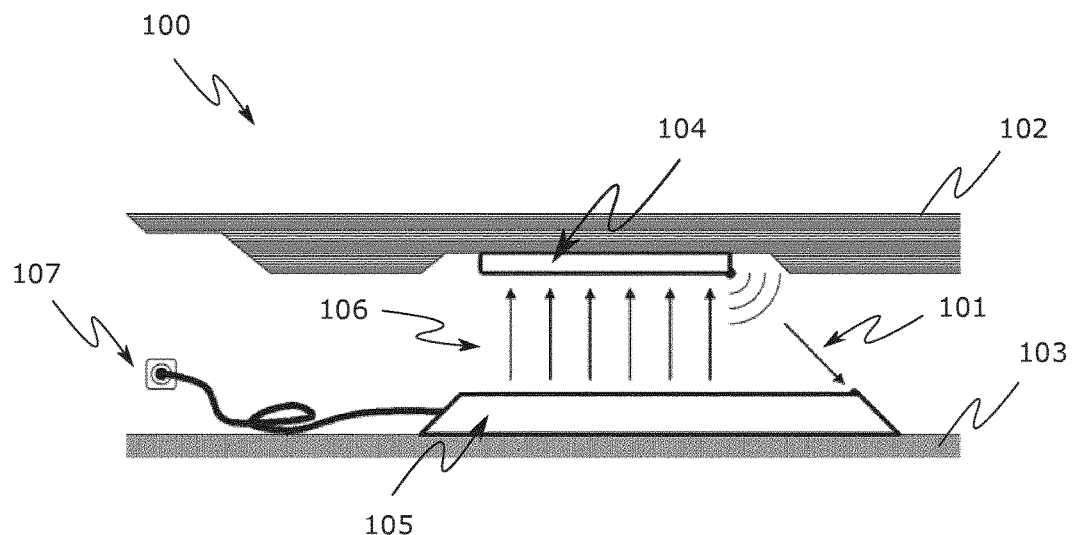
FIG. 1 shows an inductive charging system according to one embodiment of the present invention.

The illustrations in the drawings are schematic and not to scale. In the following description of FIGS. 1 to 14, the same reference signs are used for the same or corresponding elements.

In this text, the terms "capacitor" and "capacitance" as well as "coil" or "choke" and "inductance" may be used synonymously and should not be interpreted restrictively unless otherwise specified.

FIG. 1 shows an inductive charging system 100 according to one embodiment of the present invention. This shows a side view of a system for contactless charging of an electric vehicle. A car pad module (CPM) 104, which is used to supply the vehicle 102 with electricity, is located below a vehicle chassis 102. For the transmission of the energy, a magnetic field is used which inductively provides the energy from a ground pad module (GPM) 105 fixedly mounted on a floor 103. The power required for charging is taken from the main terminal 107 and can be both alternating current (AC) and direct current (DC). A separate connection 101 is used for communication between CPM 104 and GPM 105, which connection can use, for example, a radio protocol such as WLAN (wireless LAN) or NFC. This connection can be used as a feedback channel 101 or as a communication channel 101 via which the CPM 104 and the GPM 105 can exchange information. Both the magnetic field for the power transmission 106 and the radio signal 101 are electromagnetic waves which, however, have different frequencies.

Figure 2:
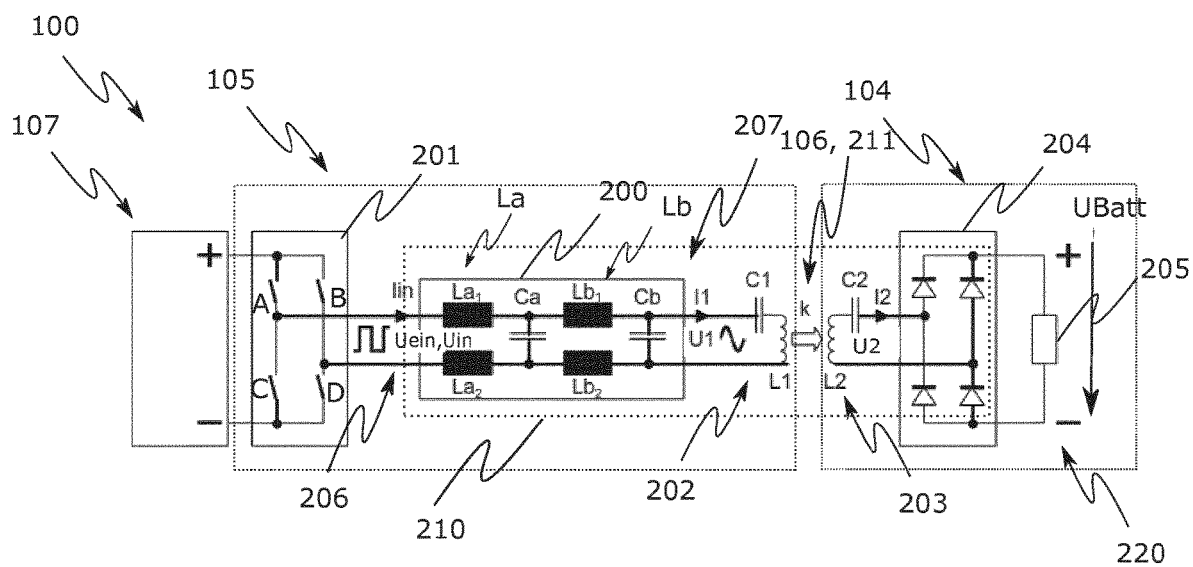
FIG. 2 shows a block diagram of an inductive charging system according to one embodiment of the present invention.

FIG. 2 shows a block diagram of an inductive charging system 100 according to one embodiment of the present invention. A system for inductive power transmission for contactless charging of an electric vehicle is considered. In such a system, an alternating magnetic field 106 is generated in the frequency range of, for example, 25 kHz-150 kHz. It must be noted that outside this frequency band, the limit values for the emission of electromagnetic waves are specified by internationally applicable standards. In order to comply with these limit values, it is crucial that the alternating magnetic field 106 works with the fundamental oscillation in the range of 25 kHz-150 kHz and contains only very low harmonics.

On the other hand, the degree of efficiency of the power transmission should be as high as possible and therefore a rectangular signal with the fundamental frequency of the alternating magnetic field is generated with electronic switches within an inverter 201, for example, by means of MOSFETs, IGBTs, because this results in very low losses. However, the rectangular signal contains considerable harmonics. These harmonics can be filtered out very well with a filter 200, for example, an LC filter 200. However, the filter 200 can be designed differently. A filter 4 of order 200 is shown by way of example in FIG. 2, but other arrangements of capacitors and coils are also possible. The input current $I_{in}$ and the input voltage $U_{ein}$ or $U_{in}$ are present at the input 206 of the filter 200. The filter 200 has two input coils $La_1$ and $La_2$ connected in series and the filter input capacitor Ca as well as the output coils $Lb_1$ and $Lb_2$ connected in series and the filter output capacitor Cb. Instead of the two input coils $La_1$ and $La_2$ connected in series, a single input coil La can also be used. Instead of the two input coils $Lb_1$ and $Lb_2$ connected in parallel, a single input coil Lb can also be used.

Two (two-pole) components are connected in series if they only have one connection in common and they are connected in parallel when they are connected to one another at both connections.

The input coils $La_1$ and $La_2$ are directly connected to the output of the inverter 201. This may directly mean that no further component is interposed. A capacitor connected in series should not turn a direct connection into an indirect connection. The output coils $Lb_1$ and $Lb_2$ at the output 207 of the filter 200 are connected directly to the coils $La_1$ and $La_2$, as well as to the primary resonant circuit 202. The primary resonant circuit 202 is supplied with the voltage U1 and the current I1 or IL, which has originated from the alternating current generated by the inverter 201. Due to the filter effect of the filter 200, the primary current I1 and the primary voltage U1 have a sinusoidal profile.

The primary resonant circuit 202 has the primary resonant coil L1 and the primary resonant capacitor C1. The primary resonant circuit 202 converts the current I1 and the voltage U1 into the alternating magnetic field 106. The alternating magnetic field 106 couples with a couple factor k into the secondary resonant circuit 203 and transmits the power from the primary circuit to the secondary circuit 203 by means of a resonant and inductive power transmission.

The secondary resonant circuit 203 includes the secondary resonant coil L2 and the secondary resonant capacitor C2. Since the secondary resonant circuit 203 is adjusted to the resonance frequency of the primary resonant circuit 202, the secondary resonant circuit 203 is excited to an oscillation by the magnetic field 106 such that it results in the secondary current I2 and the secondary voltage U2. These are fed to the rectifier 204, which can provide a DC voltage to a load 205, for example, a battery 205, an intermediate circuit 205, a traction circuit 205, or an HV-DC 205 on the side of the CPM 104.

The inductive charging system 100 is supplied via a direct voltage source 107 or HV-DC (high-voltage direct current) or via an alternating voltage 107.

Figure 3:
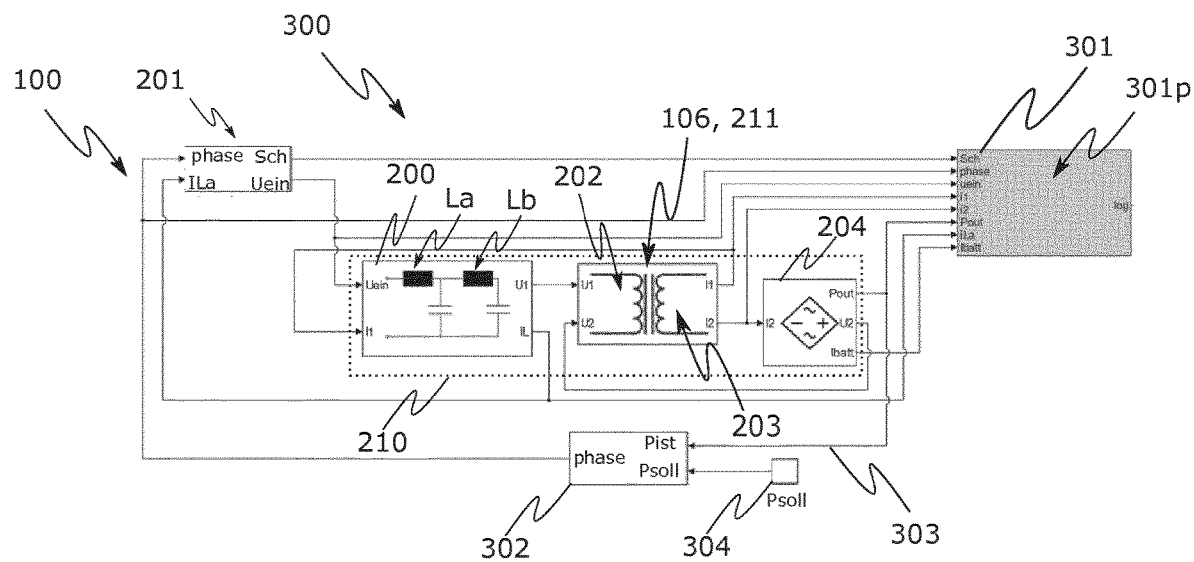
FIG. 3 shows the inductive charging system as a control loop according to one embodiment of the present invention.

FIG. 3 shows the inductive charging system 100 as a control loop according to one embodiment of the present invention. With this control loop, a wireless power transmission system (WPT, wireless power transfer) can be started reliably. This control loop allows the charging power of the inductive charging system 100 to be regulated, both during inductive charging and during start-up, switching on, or in the start-up phase.

Figure 4:
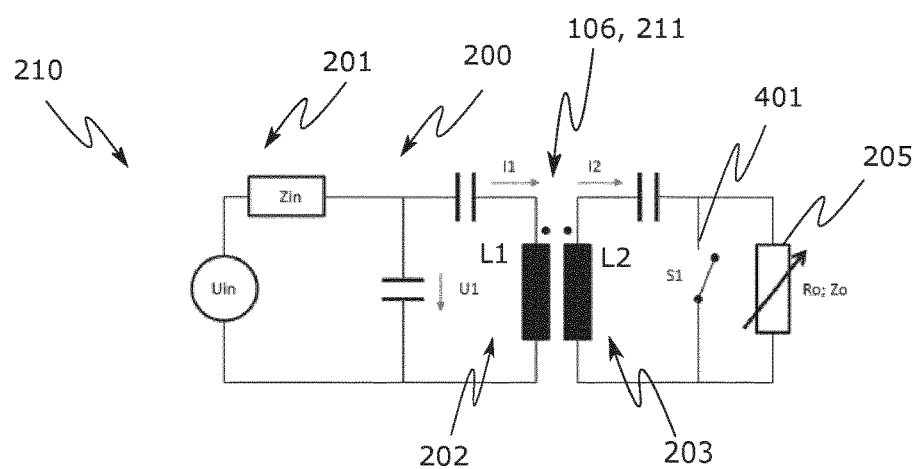
FIG. 4 is a simplified illustration of the controlled system from FIG. 3 according to one embodiment of the present invention.

FIG. 4 is a simplified illustration of the controlled system 210 according to one embodiment of the present invention.

The regulation of an ICS system 100 can contribute to ensuring the functional safety in an ICS system. Because of the strong magnetic fields 106 that are used for power transmission, there may be regulations to protect the environment from excessive magnetic radiation. These regulations can provide, for example, that a field 106 which is generated by a GPM 105 without a CPM 104 being present or that, if a CPM 104 is unfavorably coupled to the GPM, the field 106 is switched off after 2 seconds at the latest. It must therefore be ensured that it can be established within a time window of 2 seconds that the GPM 105 and the CPM 104 are correctly coupled via the field 106. Otherwise, the field 106 must be switched off. The same applies to the communication channel. If no signal can be received via the communication channel 101 for 2 seconds, the system 100 is switched off because it is assumed that the transmission is not working.

A WLAN 101 that is used for communication between the GPM 105 and the CPM 104 can have a cycle time of up to 300 ms. In order to enable a quick reaction within the predefined time, it may be desirable to get along essentially without the feedback via the feedback path 101 and therefore to use a system which essentially uses parameters that are only available on the GPM 105 and therefore to essentially require no feedback from the CPM 104. According to the control loop 300, provision may be made to measure the P1 power on the GPM 105 and to regulate it. When the GPM 105 is started up or switched on, a working point is sought at which a power of 500 W is established at P1. Subsequently, the response of the CPM 104 to this power P1 is then waited for, which is measured on the CPM 104 and reported back to the GPM 105 via the feedback channel 101. Only when this reported power exceeds a predefinable threshold value, the GPM 105 is started up further in order to continue to maintain the functional safety during inductive charging. By exceeding the threshold value, it can be determined that a working point has been found with which substantially safe operation of the charging system 100 is possible.

In this way it can also be determined that the system is operated within the ranges specified by standards. For normative reasons, it may be necessary to avoid operating a magnetic and, in particular, an electromagnetic field with a high level of power in an uncontrolled manner for longer than a specified period of time. Such an uncontrolled state can occur if, for example, a vehicle to be charged rolls away and as a result the CPM 104 essentially does not draw any power from the GPM 105.

A communication channel 101 can be used to drive up the power during the charging process or to increase to the desired power, to receive feedback from the CPM 104 about the power received. However, since the communication channel 101 can be faulty and a charging process can be aborted due to the susceptibility to errors, the system 100 provides for the presence of a power consumer 104 or the CPM 104 to be determined or detected without communication using the GPM 104 alone and the GPM 105 alone to keep power constant during the charging process without communication, so that it holds true that the power P1 in the primary resonant circuit 202 is constant. If the power in the primary resonant circuit 202 is constant, it is also true that the output power Pout at the output of the rectifier 204 and/or at the output 220 of the power transmission system 100 is constant.

All output variables of the ICS system 100 are detected in the measuring device 301. The output variables are the phase, the input voltage $U_{ein}$ or $U_{in}$ of the filter 200, the input current I1 of the input circuit 202, the output current I2 of the secondary circuit 203, the output power Pout of the rectifier 204 and/or the output 220 of the power transmission system 100, the current ILa through the input coil La of the filter 200 and the current Ibatt through the load 205 in the intermediate circuit.

The setting device 201 stores the information about the setting voltage for the control unit. For example, in FIG. 3, the output Sch is provided, which specifies the positive edge of the controlled bipolar voltage or PWM at the inverter 201 and controls the X phase of the PWM, i.e., indicates the switch pairs A, C of the inverter 201 for the transition from low to high. The switching behavior, in particular, the switching point Sch is predefined by evaluating the switching timing signal $T_{schalt}$ and the time signal of the current zero-crossing $T_{stromNullDurchgang}$ of a zero crossing measurement of the current Ia or $I_{La}$ through the coil La to evaluate and determine the switching behavior as to whether it is inductive or capacitive.

The control device 302 is set up as a phase controller and uses a search algorithm which bypasses or excludes the multidimensional limitations in a frequency duty space and searches for a working point based on P1 power.

An effective power measurement of the power P1 can be carried out on the GPM 105 and the field structure of the field 106 can be detected with the aid of the measurement of the effective power without the need for a CPM 104. Calibration of the reactive power S1 is a useful measure for measuring real power.

The start of inductive charging is carried out with a constant duty cycle and a variable frequency by the inverter 201 or PWM (pulse-width modulation) generator 201, the variable frequency being a frequency shift. The starting frequency, at which the PWM generator 201 begins, is set at the maximum possible frequency in order to adjust the greatest possible damping between the input variable, i.e., the duty cycle and the output variable from the primary component 202 to the GPM 105. In one example, the normal working frequency for the magnetic field is 85 kHz and the resonance with the lowest damping is expected in this case. In order not to be exposed to the risk of starting in a range with excessive resonance right at the beginning, it is started at a frequency that is distant from the working frequency.

This regulation rule, in order to produce the greatest possible damping between duty ratio and output variable, means at the same time that the regulating device 302 or the phase controller 302 is configured to adjust the smallest possible ratio of real power to apparent power P1/S1 in the primary circuit 202.

Starting from the maximum frequency adjusted when starting, the variable frequency approaches the resonance frequency of the primary component 202 or the resonance frequency of the secondary component 203, in particular the resonance frequency of the primary oscillating circuit 202 or the resonance frequency of the secondary oscillating circuit 203 when the frequency is reduced. The primary component 202 is located on the GPM 105 and the secondary component 203 on the CPM 104 and, when approaching the primary component 202 and the secondary component 203, in particular the primary resonant circuit 202 and the secondary resonant circuit 203, form a loosely coupled transformer 211, between which the temporal varying magnetic field 106 is formed.

Figure 5:
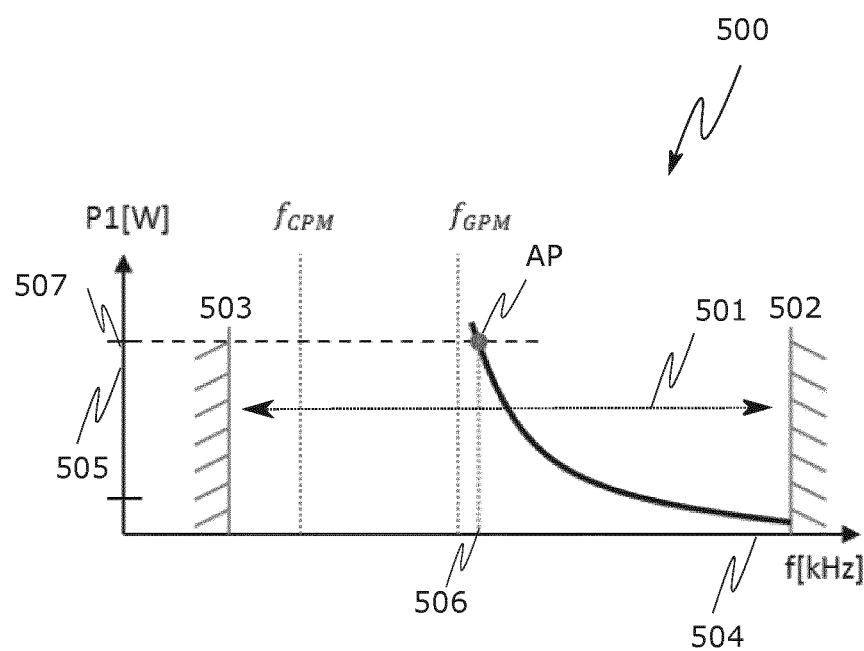
FIG. 5 is a diagram of a frequency-dependent power during a starting process according to one embodiment of the present invention.

If resonance develops in the primary component 202 and the secondary component 203, power can be transmitted between the primary component 202 and the secondary component 203 via the field 106. In other words, as shown in FIG. 5, an operating frequency, working frequency, or an optimal operating frequency is established which is close to one of the two resulting resonance frequencies of the coupled oscillating circuit including load and which allows the power transmission between the primary resonant circuit 202 and the secondary resonant circuit. There are, so to speak, two individual oscillating circuits 202, 203 that influence each other through the coupling. There is consequently the primary oscillating circuit with its resonance frequency $f_{GPM}$ and the secondary oscillating circuit with its own resonance frequency $f_{CPM}$, which are coupled to one another. Thus, there are two oscillating circuits that influence each other through the coupling and have a new common resonance frequency which has to be found and which are dependent on several factors, substantially the spacing and alignment of the coils L1, L2, and the output load. Accordingly, an overall transmission function is formed over the entire link 210 or the entire control loop 210. The overall transmission function of the power transmission system 100 over the link 210 can be described as a current gain and/or voltage gain and can also be described by a phase response.

Depending on the working point and/or the coupling k of the resonant circuits 202, 203 to one another, the working frequency, operating frequency, or resonance frequency is adjusted between 81.35 kHz and 90 kHz in one example. Since this is initially unknown, it must be found within this frequency range. A starting frequency is used to find the location. The starting frequency can be selected from the range of [90 kHz; 81.35 kHz] until it reaches a final frequency that can be selected in the range of [81.5 kHz; 90 kHz]. In other words, the frequency in the start phase can be lowered from 90 kHz to 81.35 kHz, for example, to find the working point. If the working point has been found before a range limit is reached, the frequency at the working point may be kept constant.

If, after passing through one of these frequency bands with a constant duty cycle or pulse duty ratio, a predefinable minimum power is not detected, then charging is not possible. Thus, if the GPM 105 transmits power, the power received by the CPM 104 is not above a minimum threshold value, the start-up process of the inductive charging is aborted. Consequently, if there is a low coupling between GPM 105 and CPM 104, charging is suspended or blocked. Such a low coupling can result with a large shift between GPM 105 and CPM 104. A feedforward characteristic ensures that the time interval of the start-up process does not exceed a predefinable value of, for example, 2.0 s, i.e., the time segment during inductive charging before the actual power transmission begins, in particular, the time segment during which the working point is sought. This immediate interruption of the charging process during the start phase when the predefinable minimum power is not reached can ensure safety when starting the ICS without communication between the GPM 105 and the CPM 104 being necessary. There are two feedforward characteristics. The first feedforward characteristic varies the phase shift between PWMx 1401 and PWMy 1402 at a constant switching frequency and the second feedforward characteristic ensures the frequency change at constant phase shift until the minimum power is detected, taking into consideration the maximum period of time of 2 s for finding the working point. After a valid working point has been successfully found by the two pilot control characteristics, the power controller starts with the aid of the feedback loop 101 or with the aid of the return channel 101 using the CPM 104.

The greater the distance between the GPM 105 and the CPM 104, the lower the frequency at which the power or energy can be transmitted. In other words, the greater the distance between GPM 105 and CPM 104, the lower the resonant frequency, or, in other words, the resonant frequency is a function of the distance between the GPM 105 and the CPM 104.

FIG. 5 is a diagram of a frequency-dependent power P1 during a starting process according to one embodiment of the present invention. In the diagram 500, a frequency range 501 is shown in which the variable frequency of the inverter 201 or the PWM generator 201 can be reduced starting from an upper frequency 502, for example, 90 kHz, to a lower frequency 503, for example, up to 36 kHz. In diagram 500, the frequency f in kHz is plotted on the abscissa 504 and the effective power P1 in W, which is measured on the side of the GPM 105, is plotted on the ordinate 505. While the frequency f is being reduced, the duty ratio (duty cycle) θ of the PWM remains constant. If a working point AP is found at which resonance is established between primary circuit 202 and secondary circuit 203. That is, if the coupled resonance frequency of the loosely coupled transformer 211 is found, the duty cycle θ can be increased and thus a higher power can be exchanged between GPM 105 and CPM 104. In FIG. 5, the resonance frequency 506 lies at point 506 of the transformer formed from primary circuit 202 and secondary circuit 203, for example, 85 kHz. The resonance frequency of the primary circuit 202 alone, without coupling to the secondary circuit 203, is $f_{GPM}$ and the resonance frequency of the secondary circuit 203 alone, without coupling to the primary circuit 202, is $f_{CPM}$. The threshold value of the minimum real power required at the working point AP found is identified by the reference sign 507. The working point AP is only established if the CPM 104 is also arranged in the vicinity of the GPM 105.

The GPM 105 can also be referred to as a base station 105. The base station 105 is used for the power transmission system 100 or the ICS (inductive charging system) 100. The base station 105 has the generator device 201, which is configured for generating a time-dependent power P1 having a predefinable duty ratio θ or duty cycle θ and a predefinable frequency f. Moreover, the base station 105 has a primary circuit 202 with a primary coil L1, Lprim and a primary measuring device 301p for measuring an effective power P1 and/or an apparent power S1 in the primary circuit 202. To determine P1 and/or S1, the measuring device 301 measures the input current I1 and the input voltage Uein of the filter 200. In addition, the base station 105 has a control device 302 and/or a regulating device 302 on the primary side.

The primary circuit 202 is connected to the generator device 201 and to the measuring device.

The measuring device 301 has a sub-module 301p which is responsible for determining measured values of the primary circuit 202. This sub-module may be referred to as the primary measuring device 301p and is also connected to the generator device. The control device 302 and/or the regulating device 302 is connected to the primary measuring device 301p and the generator device 201, the control device 302 and/or the regulating device 302 being configured to keep the predefinable duty ratio θ constant while it varies the predefinable frequency f 504 starting from a starting frequency 502. The control device 302 and/or the regulating device 302 is also configured to vary the effective power P1 and/or the apparent power S1 with the primary measuring device 301p while it varies the predefinable frequency.

The control device 302 and/or the regulating device 302 is also configured to keep the predefinable frequency 506 constant and to vary the predefinable duty cycle when a predefinable effective power limit value P1x 504 and/or apparent power limit value S1x 507 is/are exceeded and to exclude a predefinable combination of values for the predefinable frequency f and the predefinable duty cycle θ when varying the frequency f and/or when varying the duty cycle θ. In other words, the control device 302 and/or the regulating device 302 may have stored a predefinable number of value pairs composed of frequency values and duty cycle values, which are not assumed when running through the variable frequency f and the constant duty cycle θ.

An exclusion criterion for excluding or "bypassing" a predefinable combination of values for the predefinable frequency f and the predefinable duty cycle θ when varying the frequency and/or when varying the duty cycle can, for example, be selected from the group of exclusion criteria, wherein the group consists of capacitive switching, the design limit of electrical components, the exclusion criterion that the predefinable minimum output power Pout is not reached, the exclusion criterion that the minimum output power Pout is too volatile, and that a predefinable minimum efficiency η is not reached. In one example, the design limit of an electrical component can have the current-carrying capacity and/or the dielectric strength of the electrical component. The switching behavior, in other words whether capacitive switching and/or inductive switching of the transformer 201 exists, can be checked with the time signal Sch of the control device, measuring device 301 and/or the converter 201 and the time of the zero-crossing measurement from signal $I_{in}$ in accordance with FIG. 2.

The control device 302 and/or the regulating device 302 can use a list of permissible working points and/or a multidimensional limitation in a frequency/duty factor diagram for excluding the predefinable combination of values for the predefinable frequency f and the predefinable duty cycle θ.

The control device 302 and/or the regulating device 302 of the base station 105 has a feedback connection 303 in order to receive a feedback signal 303 from a remote device 104, in particular, a CPM 105 of the power transmission system 100, which indicates the size of a received power Pist that is transmitted via the energy transmission system 100 at the specifiable frequency f and the specifiable duty cycle θ. This feedback connection 101, 303 may support at least one transmission protocol from the group of the transmission protocols WLAN, Bluetooth, and NFC (near field communication).

The control device 302 and/or the regulating device 302 may have a connection via which the control device 302 and/or the regulating device 302 can send a signal with which the generation of the time-dependent power in the generator device 201 can be stopped when the size of the received power Pist falls below a predefinable value 507 within a predefinable period of time. The predefinable period of time can be 2 s. To measure this period of time, the control device 302 and/or the regulating device 302 can have a timer. When stopping, all drivers of the primary circuit 202 are deactivated, for example, the converter 201 and the filter 200. In particular, the H-bridge with the switches A, B, C, D of the converter 201 is put into the state in which all switches are open, i.e. into the state A=B=C=D=open. This is also the state in which the converter 201 is shown in FIG. 2. The "phase" output of the control and/or regulating device 302 in FIG. 3 is the output for controlling the phases in order to influence the phase shift of the signals PWM-X and PWM-Y at the H-bridge of the converter 201. In order to stop or switch off the drivers, the H-bridge is activated by a signal phase=0 at the corresponding output of the control and/or regulating device 302, which causes the generated power to be reduced to a nominal value of zero, i.e. Psoll=0.

The working point AP is indicated by a parameter tuple 506, 507, which includes a coupling factor (k), the inductance of the primary coil ($L_1$, $L_{prim}$), a supply voltage ($U_{Batt}$), a first capacitance ($C_a$) of a filter or an input capacitance $C_a$ of a filter 200, a second capacitance ($C_b$) or an output capacitance $C_b$ of the filter 200, the predefinable duty cycle (θ), and the predefinable frequency (f).

The predefinable frequency f 504 is varied decreasing from the starting frequency 502 from the range of [90 kHz; 85 kHz] up to a final frequency 503, wherein the final frequency is selected from the range of [81 kHz; 0.36 kHz].

The primary measuring device 301p can be configured to calibrate measured values that have been determined when measuring the real power P1 and/or the apparent power S1 by means of a previously determined calibration factor. For example, an offset value, a phase shift, or a holding time can be determined for calibration, which is added or subtracted in future measurements of the real power P1 and/or the apparent power S1, and/or as an additional holding time of a sample-and-hold element. The phase shift can be adjusted with the sample-and-hold element, in particular during one of the measurements of U1 or I1, in order to determine a calibrated power. The multiplication of U*I contains a time-delayed voltage and/or current signal, e.g., $P(t)=U(t-tcalU)*I(t-tcalU)$.

The control device 302 and/or the regulating device 302 can be designed as an FPGA, ASIC, processor, or microcontroller.

The power transmission system 100, for example, an ICS system 100, has a base station 105 or GPM 105, a remote device 104 or a CPM 104, wherein the base station 105 and the remote device 104 can be loosely coupled to one another via an inductive coupling and the feedback connection 303. The base station 105 has the primary circuit 202 and the remote device 104 has the secondary circuit 203. The primary circuit 202 has the coil L1 and the secondary circuit has the coil L2. If the coils L1 and L2 are brought closer to one another, magnetic fields 106 which are generated by the coils can penetrate the other coil L1, L2. The part of the magnetic field that penetrates the other coil L1, L2 forms the inductive coupling with the couple factor k or the coupling factor k. This coupling forms a loosely coupled transformer 211. The part of the magnetic field 106 which lies outside the respective other coil L1, L2 forms a stray capacitance. The smaller the part of the stray capacitance that is formed, the greater the couple factor k. However, because a transformer with a core in which the couple factor k is essentially constant cannot be formed due to the mobility of the GPM 105 and CPM 104 with respect to one another, the couple factor in the loosely coupled transformer is variable and depends, for example, on the relative position of the GPM 105 and CPM 104 to each other.

Figure 6:
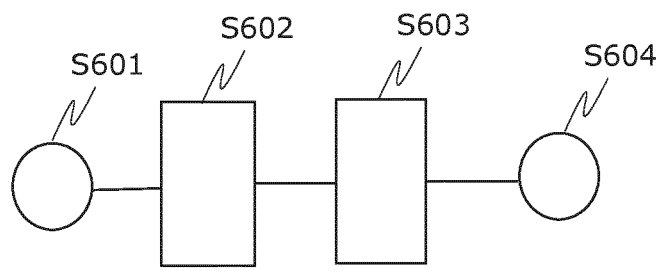
FIG. 6 is a flow chart for an inductive charging process according to one embodiment of the present invention.

FIG. 6 is a flow chart for an inductive charging process according to one embodiment of the present invention. Starting on the idle state S601, it is recognized that a charging process is to be started. A triggering event can be, for example, that the regulating device 302 or the measuring device 301 recognizes that the GPM 105 and CPM 104 have moved by a predefinable distance from one another. In another example, the charging process can also be started by a CPM 104.

In the function block S602 or the state S602, a calibration of the ICS system 100 and in particular of the components of the GPM 105 is first carried out. In this calibration process, variable and system-specific parameters are determined in order to calibrate the measuring device 301.

After the calibration, the inductive charging including the startup of the ICS system 100 is carried out in the function block S603, wherein the startup and starting process essentially include finding the working point AP. Depending on the fulfillment of the functional safety, charging by means of the ICS system 100 or the switching off of the ICS system then takes place in state S603 and the charging process returns to the idle state S604. It is switched off, for example, if charging cannot be started within a predefinable time interval or time window. This time interval can be 2 s.

The parameters or the calibration factor found during the calibration phase S602 can be taken into consideration both during the startup and during the charging process in the charging phase S603. The calibration phase S602 is run through each time a charging process is started.

Figure 7:
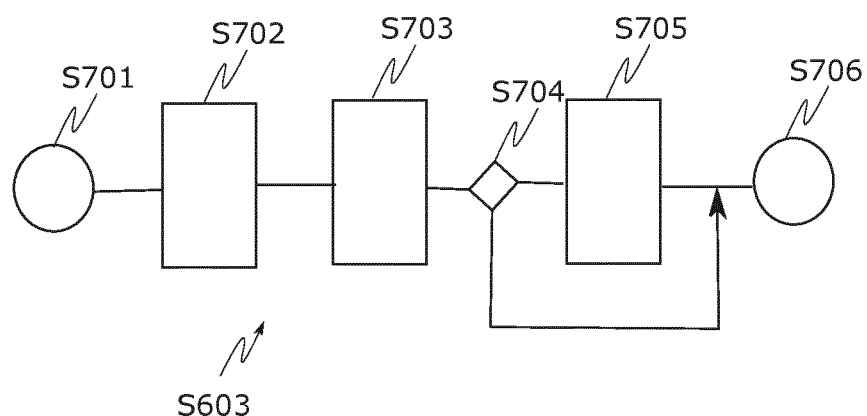
FIG. 7 is a flow chart for the charging phase including the startup according to one embodiment of the present invention.

FIG. 7 is a flow diagram for the charging phase S603 including the startup according to one embodiment of the present invention.

The charging phase S603 includes a method for controlling and/or regulating a base station 105 or a power transmission system 100. For the startup phase, starting from an idle state S701 in the state S702, a time-dependent power with a predefinable duty cycle θ and a predefinable frequency f are generated. In the state S703, the predefinable frequency f is then started to vary on the basis of a starting frequency 502 and, at the same time, the predefinable duty ratio θ is kept constant. While varying the frequency f with a constant duty ratio θ, the real power P1 and/or the apparent power S1 is measured in a primary circuit 202 of the base station 105 by means of the measuring device 301.

The startup process S702, S703 can be summarized by the following processes. It will be started at the maximum frequency and a first duty cycle is set. Then, the frequency is reduced until P=Pstart. Pstart is the regulation start power. This is the minimum power at which the feedback loop 101 is initialized.

If no working point AP can be found, a search is made in the other direction at low frequencies. It may occur that during a startup with fstart=fmax, the working point cannot be found if Iin>Iinmax, i.e., the current Iin through the filter 200 exceeds a threshold value at a frequency fmin<f(Iinmax)<fmax. Iin is the current through La and Lb is the current through Lb. The current Iin is measured via La. The current Ib can be calculated via Lb or can also be detected or measured using the other parameter. In one example, the pre-control direction can reverse and start at the low frequency, with a different default duty cycle and then the frequency can be increased so that a stable working point AP can be found at a frequency fAP 506 at fAP<f (Iinmax).

If no working point AP is found after passing through the frequency band 501 in both directions, the filter capacitances Ca, Cb are switched. The adjustment of Ca, Cb also adjusts the input impedance and thus the phase position from Iin to Uin over the frequency band [80--90 kHz]. The capacitive ranges with a first configuration that are to be excluded may no longer be capacitive and therefore usable with other configurations. The disconnection of half an output capacitor Cb/2 and connection of further input capacitors Ca of the filter 200 leads to an increase in the phase reserve and thus to inductive switching behavior. This connection and disconnection may, however, lead to higher losses and/or to a reduction in power, and thus, one example always starts with the configuration that includes the "largest capacitive ranges".

If, despite a search in both directions and switching of the capacitances Ca, Cb, AP is not found, in state S704 the start-up phase is aborted in the state S704 and the ICS system 100 is switched off. Starting from an upper frequency range and then starting from a lower frequency range, it is consequently evaluated again and again whether a valid working point AP has already been found, and when this AP is found, the process is started. Otherwise, the process is canceled.

After the exceeding of a predefinable effective power limit value P1x 507 and/or apparent power limit value S1x 507 has been recognized in function block S704, the predefinable duty cycle θ is varied in state S705 while the predefinable frequency f, 506 is kept constant at the same time. While the predefinable frequency and/or the predefinable duty cycle θ is varied, that is, during the states S703 and S704, a predefinable combination of values for the predefinable frequency f and the predefinable duty cycle θ is monitored or excluded. The charging process is started.

However, if the working point AP, which is identified by the predefinable active power limit value P1x 507 and/or apparent power limit value S1x 507, is not recognized within a predefinable time of, for example, 2 s, the function block S705 is skipped and the charging process is not started or aborted.

The method ends in the idle state S706.

In the following, further details of the control device 302 and/or regulating device 302 shown in FIG. 3 will be discussed. The control device 302 and/or regulating device 302 is designed as a phase controller. It receives a nominal power value Psoll and an actual power value Pist. The loose coupling of the primary circuit 202 and the secondary circuit 203, when they approach one another, forms a resonance transformer 211 or a resonance converter 211. The aim of the frequency controller 302 in the resonance converter 211 is to search for or adjust a working point AP at which the degree of efficiency η is as high as possible, i.e., for which the condition η→1 and for which inductive switching takes place. In this context, inductive switching means that the PWM generator 201 sees the filter 200 as an inductive load, i.e., the current should lag the voltage so far that the voltage in the generator 201 or inverter 201 is commutated when the switch is opened.

The filter 200 substantially serves to filter out harmonics that arise when the square-wave signal of the PWM of the generator 201 is generated, in order to provide the primary circuit 202 with a signal that is as sinusoidal as possible. The filter 200 can be adjustable, for example, to allow for the adjusting of the inductive switching behavior. At the same time, ZVS switching (zero voltage switching) of the switches of the generator 201 can be enabled in order to reduce losses. The filter 200 can be adapted to the respective working point.

The working point AP is defined as the point at which the required target power Psoll can be transmitted in a stable and constant manner. After the working point AP has been reached, the controller 302 or the regulating device 302 ensures that at least three boundary conditions are complied with. A first boundary condition is the inductive switching behavior of the generator 201 and the current limitation. The current limitation, in particular the switching current limitation, limits the filter current $I_{in}$ through La. Inductive switching is determined by measuring the time of the zero crossing of the current $I_{in}$ and is adjusted by changing the switching time of the input voltage $U_{ein}$ or $U_{in}$ or by shifting the control frequency.

This current limitation and the inductive switching behavior are used for safety. Another boundary condition to be met by the controller 302 is to ensure that after the start-up phase S703, constant charging with a constant charging power Psoll takes place. In addition, as a further boundary condition, the controller should ensure that the degree of efficiency maximizing is maximized during the charging process in the state S705 to ensure optimal operation. Since it is not always possible to meet all three boundary conditions equally well, the controller 302 can prioritize the boundary conditions. The safety-relevant boundary condition is given a higher priority than the boundary condition relating to the charging power Psoll. However, this second boundary condition again has a higher priority than the boundary condition that relates to optimal operation.

The controller 302 can influence the operating parameters of the generator 201 as a setting parameter. The operating parameters of generator 201 include the frequency f and/or the period of the PWMx/y signals T, as well as the phase shift θ of the two signals PWMx and PWMy to each other.

Figure 14:
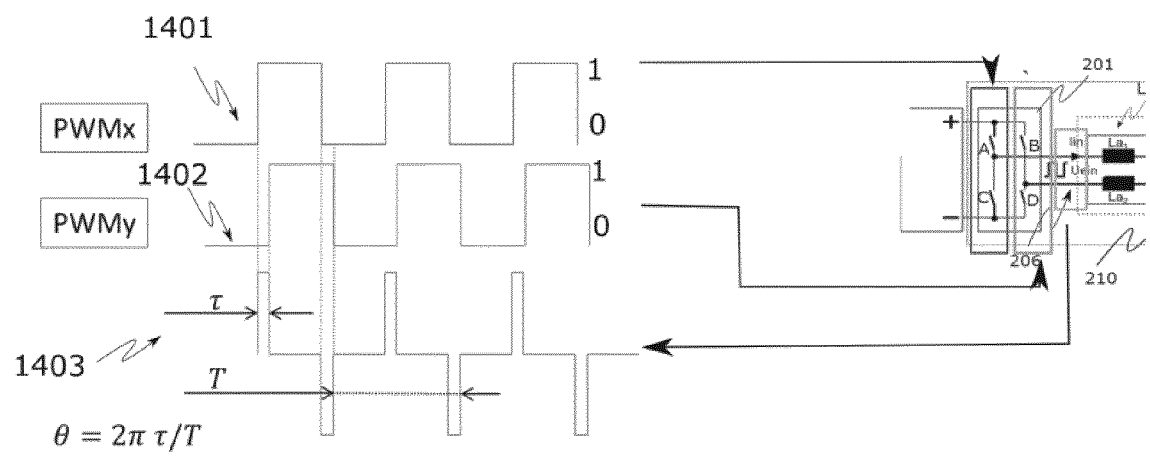
FIG. 14 is a time diagram for the control of a converter for generating a PWM at the input of a filter according to one embodiment of the present invention.

FIG. 14 is a time diagram or control scheme for the control of the converter 201 for generating a PWM at the input 206 of the filter 201 according to one embodiment of the present invention. The first time diagram 1401 shows the first control signal PWMx 1401 for the first switch group A, C and the second control signal PWMy 1402 for the second switch group B, D as a time diagram. A high value or 1 means that the switch is switched on and 0 or "Low" means that the switch is switched off. The result of the specified switching pattern is a voltage profile $U_{in}$, $U_{in}$ 1403 which fluctuates between a positive and negative voltage value. A signal change from 0 to 1 is understood as a positive edge and a signal change from 1 to 0 is understood as a negative edge. The positive edges of the first control signal PWMx 1401 and of the second control signal PWMy 1402 are offset by a time shift τ. This time shift corresponds to a phase shift of the PWM signals. The time shift is shown in the resulting voltage curve as a pulse width which can be converted into the duty ratio θ=2πτ/T. The period of the resulting voltage curve is the time interval between two identical signal states and is marked with T. The signals PWMx 1401 and PWMy 1402 are square-wave signals with which the generator 201 activates the switch group A, C, or B, D of a full bridge circuit or H-bridge over the period T. The frequency f indicates the number of state changes within T. This creates the duty cycle θ.

The configuration of the system 100 is determined by the internal parameters of the system. The system parameters, which, depending on the position of the GPM 105 and CPM 104 in relation to one another and the battery voltage UBatt, span all possible working points, are the coupling factor k, the inductance of the primary coil L1 or Lprim, the output voltage or intermediate circuit voltage UBatt and the switching capacities Ca, Cb which are adjusted via switches so that the capacitances result from a large number of CaX, CbX capacitances, the capacitances of which are added Ca={Ca0, Ca0+CaX}, Cb={Cb0, CbX}. The filter 200 thus has an array of capacitances connected in parallel and/or in series, which can be connected and disconnected as required. It is also possible to use an array of parallel and/or disconnectable coils accordingly. UBatt, Ca, Cb are known from the specifications during manufacture. This means that a working point AP is defined by the following parameter combination or the parameter tuple:

k, Lprim, UBatt, Ca, Cb, θ, f

When analyzing families of curves for variable frequency f, variable duty cycle θ or variable duty cycle θ and constant coupling factor k and constant inductance of the primary coil L1 or per curve Lprim as well as constant output voltage UBatt, it has been shown that in order to keep the power P1 constant, the steepness of the curve increases with decreasing coupling k. Finding a working point is therefore a control and/or regulating task that a highly sensitive system must master. The controller 302 should therefore be dimensioned in such a way that a compromise can be found between controller dynamics, resolution, and robustness. Since the resolution is determined by the measuring system and hardware components and the components used, the method for the search for the working point that is used for the controller 302 is based on a method in which the dynamics of the search for the working point is limited so that the search for work is done is very small steps, i.e., with very small frequency changes. These small steps prevent stability problems or overshoots from arising even at the working points AP, in which a small working frequency variation in a time interval DeltaT leads to a relatively large change in performance. The working frequency variation is defined as the ratio of the change in the working frequency to the time interval Delta(working frequency)/DeltaT and the power change is defined as the ratio of the power change to the time interval deltaPi/deltaT.

Figure 8:
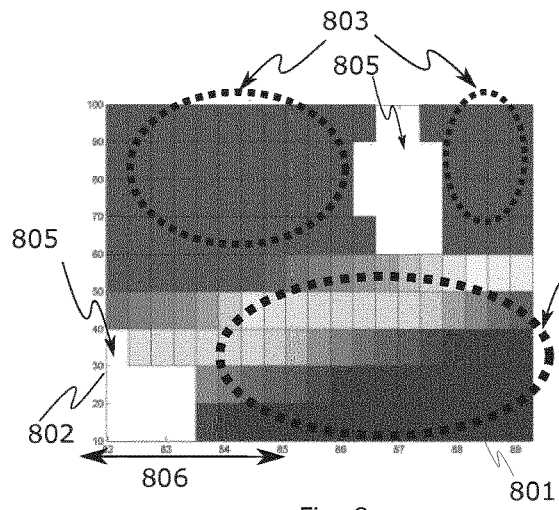
FIG. 8 is a diagram of a three-dimensional illustration of a transmitted power over a frequency and the duty ratio according to one embodiment of the present invention.

FIG. 8 is a diagram of a three-dimensional illustration of the transmitted power Pout over the frequency η and the duty ratio η according to one embodiment of the present invention. The abscissa 801 gives the frequency f in kHz from 82 kHz to 89 kHz and the ordinate 802 indicates the duty cycle θ or the phase shift in percent % from 10% to 100%, wherein, according to FIG. 14, the duty cycle θ or the phase shift is related to the period, so that it results in the percentage value as $$\frac{\theta}{T} \cdot 100.$$

The color values indicate the measured real power P1 in the primary circuit 202.

The power Pout varies between 0 kW and 3.3 kW. There are substantially 3 ranges. In the 803 power range, the power is on the order of 3.3 kW. In the power range 804, the power is on the order of magnitude of 0 kW. Inductive switching is possible in the ranges 803 and 804, i.e., the filter 200 behaves like an inductive load or the boundary condition of the inductive behavior is fulfilled. A capacitive behavior is evident in the ranges 805. The regulating device 302 is therefore configured in such a way that it prevents the occurrence of corresponding value combinations of the frequency f and the duty ratio θ.

Figure 9:
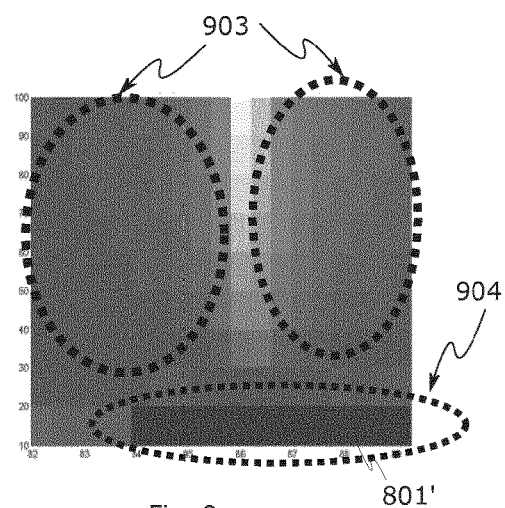
FIG. 9 is a diagram of a three-dimensional illustration of the degree of efficiency over the frequency and the duty ratio according to one embodiment of the present invention.

FIG. 9 is a diagram of a three-dimensional illustration of the degree of efficiency η over the frequency η and the duty ratio η according to one embodiment of the present invention. The efficiency is plotted qualitatively in FIG. 9. In the range 904, the efficiency is low, and, in the range 905, the degree of efficiency is high.

From FIG. 8, it can be derived that a high powers Pout can often be achieved at low frequencies with a smaller duty compared to high frequencies. From the diagram for the degree of efficiency of FIG. 9, it can be deduced that high efficiencies can occur both in the low and in the high frequency ranges, wherein a good degree of efficiency for most configurations occurs in the frequency range of 81 kHz-85 kHz, i.e., in the range of [81 kHz; 85 kHz]. This frequency range is identified by reference sign 806 and is part of the permitted frequency range 501. It can thus be seen that an example system configuration (Ca, Cb, La, L1, C1, L2, C2) in this lower band 806 of 501 achieves the highest degrees of efficiency due to the configuration of the overall system. The picture may be different for a different system configuration.

The controller 302 is therefore configured in such a way that the search for the working point AP starts at a high frequency as the starting point. —At high frequencies, a small change in frequency f or a little change in the duty θ or the phase shift θ causes, because of the lower sensitivity in this range, less change in power than at low frequencies. Consequently, the direction of change from high frequencies to low frequencies is preferable to the direction of change from low frequencies to high frequencies, although both control behaviors of controller 302 are possible. In a setting phase, the controller 302 should be checked to the effect that a special configuration of the controller 302 also fulfills the condition that a reduction in the frequency leads to a local improvement in the degree of efficiency. Or in other words, that $$\frac{\partial Pout}{\partial f}(fgro\beta) < \frac{\partial Pout}{\partial f}(fklein) \text{ applies,}$$

where fgroβ refers to a large frequency and fgroβ refers to a small frequency. This condition may not be fulfilled for every configuration. In the diagrams according to FIGS. 8 and 9, local optima of the degree of efficiency η can also take place in other configurations and with differently selected parameters at high frequencies. Pout indicates the output power of the CPM 104 at the output 220. The GPM 105 receives the information about the output power Pout via the communication channel 101, for example WLAN, from the CPM 104 every 100 ms.

However, it is always the case that with low powers, as in the range 804, the degree of efficiency also falls, as the range 904 shows. It would therefore be conceivable to have a target value depending on the target output ηsoll (Psoll) for the degree of efficiency to prevent small fluctuations around the working point. If the improvement in the degree of efficiency is better than S, the frequency should still be varied.

The controller 302 can also be set up to recognize that the switching behavior of the ICS system 100 is moving in the direction of a capacitive behavior, that is, that parameter combinations can occur that lead to a power that is in the capacitive range 805, the controller can 302 carry out switching measures on the filter 200, which change the physical configuration of the filter 200 such that inductive operation is possible again. For example, an additional capacitor could be connected in parallel to the input capacitor Ca and/or to the output capacitor Cb, or an array of filters to form a switchable filter.

When the controller is in operation, it can be assumed that a large part of the frequency duty ranges that can be specified by frequency duty tuples are not permitted and must therefore be avoided or bypassed by the controller 302 or are to be bypassed by other suitable measures, such as switching the filter 200. In particular, such forbidden ranges can turn out large, in particular with small couplings k. This has the consequence that the controller 302 essentially constantly has to monitor the boundaries between the inductive and capacitive range and that a suitable start-up strategy or a control behavior for the controller 302 for the startup must be found in order to reach the desired operating points. A switchover of capacitances Ca, Cb is also necessary in order to achieve full power with small and large coupling, in order to be able to transmit Pout=3.3 kW, range 803 in FIG. 8. The power controller in 302 is designed as a PI controller.

Figure 10:
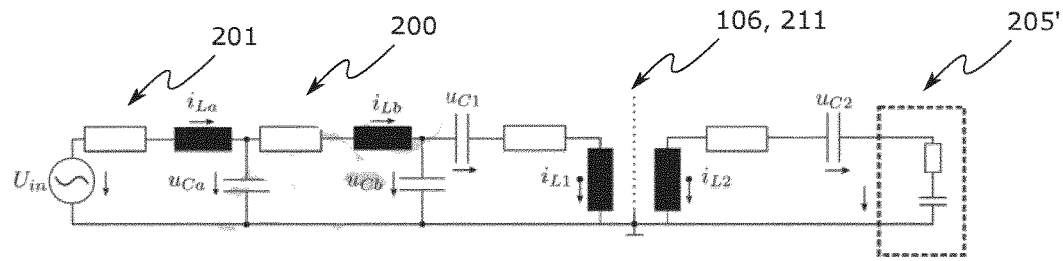
FIG. 10 shows a linearized equivalent circuit diagram of the ICS system from FIG. 2 according to one embodiment of the present invention.

FIG. 10 is a linearized equivalent circuit diagram of the ICS system 100 from FIG. 2 according to one embodiment of the present invention. This linearized system extends from the inverter 201 or generator 201 to the battery or load 205. This linearized system can be assumed with a sinusoidal excitation by the generator 201.

The rectifier 204 was replaced by an RC element 205', which maps the system of rectifier and battery for a given parameter tuple k, Ubatt, Pout in the linearized model. The frequency dependency was not taken into consideration for the calculation due to the small influence. For maximum power, the current in the secondary circuit is I2eff=16.67 A.

From this value, it is possible to calculate all other effective values in the system for k, L1, Ubatt, Pout for the system dimensioning These effective values k, L1, Ubatt, Pout were calculated for a battery voltage of U=350V and an output power Pout=3.3 kW. The conditions in the working point are as follows:
Uin<350Veff
Uin/cos(phi)<350Veff
Inductive
Ia, Ib<35Aeff
I1<28Aeff If these conditions are met, with the help of the frequency controller (not shown in FIG. 3), the optimal working point, at which the losses are minimal, is sought for the configuration {P, Ubatt, k, L1, L2}, geometrically and in a load-dependent manner. These conditions are hard conditions, i.e., conditions that must be met for a specific system.

There are an infinite number of working points in the continuum. Stationary working points are defined as working points at which the power, in particular the target power, is kept constant. Working points that can be approached, i.e., from P=Pstart=500 W to P=Psoll are possible working points. Points that are as close as possible to Psoll are also possible working points. In addition, local degree of efficiency maxima are sought, of which there may be a plurality in the approachable range. In order to obtain a stationary working point AP, its approachability must also be ensured during the startup phase. The working points AP that are located within the same closed region as the starting point can be reached with a continuous change in frequency and duty cycle. APs that are located outside of this region can only be reached if the controller performs a frequency/duty jump through the prohibited regions. In addition, it should be considered that if there are a plurality of local optima, the working point AP that is closest to the starting point is selected (local frequency optimizer) AP. In other words, this means that the operating strategy increases the power from 500 W to P=Psoll and thereby limits the duty cycle θ, in particular the phase shift τ, upwards in order to comply with current and voltage limits, and searches for a frequency that allows the duty cycle to be increased again so that the power is increased. This process is carried out iteratively on the basis of preferred directions by deciding whether the frequency should be incremented or decremented. The decision about the preferred direction is in turn made dependent on the electrical conditions. In one example, an optimum is searched for with the help of a maximum power point tracker and an indication of a high current Ia is used to reduce the frequency and a capacitive switching behavior is used as an indicator to increment the frequency.

By adhering to the boundary conditions, the controller in the resonance converter of the GPM 105 can also ensure stable energy transfer with L2 and C2, so that Pout remains essentially constant, although parameters such as the coupling factor k may change, for example, if a car is being charged while the energy transfer reduces a distance between GPM 105 and CPM 104. Since the efficiency is maximized and at the same time the states of the system have to be monitored, the integration of the controller with the maximization of the efficiency and the limitation of the states can be described as an optimization problem.

In the following, the calibration phase carried out in state S602 will be discussed further, which determines specific parameters or a calibration factor in order to be able to operate the measuring device 301 correctly.

In the ICS (inductive charging system) 100, the primary power P1 is regulated by the controller 302. The controller 302 receives the value of the primary power P1, as shown in FIG. 3, from the measuring device 301 via the connection 303, 101, which is connected to the output Pout of the measuring device 301. Pout is the power at output 220 of CPM 104 across the resistor 205.

Due to tolerances, for example due to the scattering of the magnetic field 106 and different device configurations, for example, the use of a 4th order filter for the filter 200, the phase shift detected by the measuring device 301 changes from current to voltage in the primary field, i.e., in the field which is generated by the primary coil L1. This phase shift concerns the phase shift of the measurement, not the phase shift of the real states. This means that although the system 100 and in particular the primary circuit 202 operates with a real or actual phase shift and thus a power P1 is actually generated, the controller 302 and/or the measuring device 301 assumes incorrect values for the phase difference between current and voltage and thus also from an incorrect power P1 or Pact. Accordingly, although a power P1 is actually present in the system 100, the controller 302 assumes an incorrect power Pist. The power is falsified because the phase shift results in angle errors. This is because the method used for measuring the power in the measuring device 301 calculates the power P1 from the evaluation of the phase position between the current I1 and the voltage U1.

In order to eliminate the measurement errors caused by the angle errors, a sample-and-hold device 1103 can be provided in the measuring device 301 during the power measurement, which has a correction device which is set up to use a time delay or a group delay to compensate for and/or fix the angle errors. The "continuous measurement signal", i.e., the sinusoidal current I1 or the sinusoidal voltage U1 is recorded digitally and also delayed via a holding element before this signal is multiplied by U1 or I1, so that a positive phase shift can be added to one of the two time signals.

The regulation in the controller 302 is based on a power measurement S1 of the oscillating circuit 202, which operates with a frequency of the converter 201 in the range of 80 kHz-90 kHz and with a correspondingly short period. The apparent power S1 that is to be measured is very high and can be on the order of magnitude of 1100 kVA. While at a power measurement of a power of 50 W to 500 W at 50 Hz a phase error or a dead time on the order of 0.1 s, which is included in the result due to the measurement errors in the hardware, has only a minor effect, a dead time of 0.1 s with a correspondingly short period of an oscillation in the range of 80 kHz to 90 kHz is much more noticeable and the falsification of the measurement result compared to the actual values of the power cannot be tolerated, especially not if working points of the ICS system are to be set and controller 302 has a has high sensitivity.

That the phase error depends on the measuring device 301 and can therefore differ from measuring device to measuring device and can differ even with measuring devices of the same design, makes the consideration of the phase error more difficult. Since the group delay/phase rotation can differ from ICS system 100 to ICS system 100, the calibration of power P1 is carried out in each start-up phase S602 before inductive charging in phase S603 the charging process take place in parallel with the finding of the working point in the phase S702, S703 of the charging process. In the start-up phase the active power P1=0W or primary field power P1=0W is with a low duty cycle, since no power should be transferred during the start-up phase, but only the working point should be determined. Calibration to exactly 0 W is very difficult and cannot be ensured without leaving the approved frequency band. But one can assume P1=0 W with little error. Although there is substantially no real power P1, there is a high apparent power. P1<<S1 applies. If the frequency band is too small, the power measurement is calibrated using the $$\cos(\phi) = \frac{P}{S} = 0$$

between I1 and U1. As a rule, however, it is sufficient that P1<<S1, in order to successfully carry out a calibration to 0 W. Even if, for example, P1=100 W were real but S1=5000 VA, with a calibration of Φ on π/2 (90 degrees) at a real angle of 88.85 degrees in this working point, the angle would be calibrated to 1.3% rel. error, which is still very accurate.

This principle, which is presented in formulas (K7) and (K8), ensures a calibration of the power at low powers. The deviations can be greater for high power. The regulation of the small powers is a challenge with the ICS because it is difficult to determine whether a working point has been found. In addition, it is difficult to regulate the minimum power on the output side 220. Or, in other words, with this angle adjustment method, small powers—i.e., powers with small ratio of real power to apparent power P1/S1—can also be very well set and/or controlled autonomously, which ensures the autonomous start of power, i.e., without using CPM 104, and leads to a more precise power detection. The output power Pout at the output 220 can thus also be adjusted and controlled very precisely With reference to FIG. 4, the following abbreviations from Table 1 are used.

TABLE 1

| Variable/ definition | Designation | Description |
| --- | --- | --- |
| $P_{mess}$ | Measured real power | Determined real power from the primary oscillating circuit |
| $\Phi_{UI}$ | Phase shift between current and voltage | Phase shift between current and voltage |
| $\Phi_{U, mess}$ | Phase shift between real and measured voltage | Phase shift between real and measured voltage |
| $\Phi_{I, mess}$ | Phase shift between real and measured current | Phase shift between real and measured current |
| $\Phi_{mess}$ | Measured phase shift | Measured phase shift |
| $\Phi_{CAL}$ | Calibration value phase position | |
| $\Phi_{CAL, DEF}$ | Default calibration value phase position | |
| P | Real power | Real power measurement |
| u(t) | Real current | Time signal of the real current measurement |
| i(t) | Real voltage | Time signal of the real voltage measurement |
| $I_{mess}(t)$ | Measured current | Analog/digital measured current (shown in the continuum). Based on I1. |
| $U_{mess}(t)$ | Measured voltage | Analog/digital measured voltage (shown in the continuum). Based on U1. |
| $U_{rms}$ | Rms voltage | Rms voltage measurement. Based on U1 |
| $I_{rms}$ | Rms current | Rms current measurement. Based on I1. |
| $\Phi_{Erhor}$ | Phase position detection error | Phase position detection error |
| CPM | Car pad module | Car pad module |

TABLE 1-continued

| Variable/ definition | Designation | Description |
| --- | --- | --- |
| GPM | Ground pad module | Ground pad module |
| S1 | Crowbar | Short circuit switch |
| $f_{sw}$ | Control frequency | Control frequency or working frequency of the GPM |
| $T_{CAL}$ | Delay for performance detection | Value that is used exclusively for calibration |

In the following, the power calculation P1, S1 in the primary circuit from the primary current I1 and the primary voltage U1 is considered. For the sake of simplicity, however, the derivation is carried out without the indices applicable to the primary circuit. Despite the general derivation, it is clear that this also relates to the primary circuit.

The power measurement takes place in the primary circuit 202 on the GPM side by means of a measuring device 301. The real power measurement P_real or $P_{real}$ is made with the help of the effective current $I_{mns}$, $U_{mns}$ and the phase position φ is determined from the current to the voltage $\phi_{UI}$ $$P_{real} = P = \frac{1}{T}\int_0^T u(t) * i(t) \quad (K1)$$

$$S_{real} = S = \frac{1}{T}\sqrt{\int_0^T u^2(t) \cdot \int_0^T i^2(t)} = U \cdot I \quad (K2)$$

$$\cos(\phi) = \frac{P}{S} = \frac{P}{U_{rms}I_{rms}}. \quad (K3)$$

When coupling the GPM 105 and the CPM 104, a time-variant magnetic field 106 is built up. In order to make the field 106 time-variant for the inductive coupling, the control 201 or the PWM generator 201 generates a PWM signal with a duty cycle θ. The PWM signal is a voltage curve, the duty cycle θ can be converted into the level of a voltage, which in turn results in the power to be transmitted, the size of which is related to the duty cycle. In this way, the duty ratio θ can be used to control the transmitted power of an ICS system. The input voltage Uein or Uin is the voltage which the generator 201 generates and which is made available to the filter 200. The filter 200 generates the primary voltage U1 and the primary current I1 for the primary circuit 202. The primary current I1 and the primary voltage U1 are transformed into the secondary current I2 and the secondary voltage U2 for the secondary circuit 203 by the loosely coupled transformer 211 that is being formed. In order to describe the conversion of the various voltages and currents into one another, various transmission functions can be defined.

The transmission function $G_{U_{in}I1}(s)$ is the transmission function from the input voltage Uin or Uein to the primary current I1.

The transmission function $G_{U_{in}U1}(s)$ is the transmission function from the input voltage Uin or Uein to the primary voltage U1.

The transmission function $G_{I1U1}(s)$ is a transmission function from the primary current I1 to the primary voltage U1.

The transmission function $G_{I1I2}(s)$ is the transmission function from the primary current I1 to the secondary current I2.

These boundary conditions and transmission functions show how a large P1/S1 ratio can be adjusted. A P1/S1 can be generated with the transmission functions.

It should hold that $\|G_{i1I2}(s)\|_2 \geq 0.5$, i.e. at maximum secondary current I2. If the amount of gain from the primary current I1 to the secondary current I2 is greater than or equal to 0.5. The ratio $\|G_{i1I2}(s)\|_2$ is used for normal operation and is not used for calibration. $0.5 \leq \cos(\sphericalangle G_{I1U1}(s)) \leq 1$, that is, while the ICS system 100 is transferring energy, the cosine of the angle of the transfer function from primary current I1 to primary voltage U1 lies between the values 0.5 and 1.

$\cos(\sphericalangle G_{I1U1}(s)) \to 0$, i.e., if no power can be transferred to the secondary side, the cosine of the angle of the transfer function goes from primary current I1 to primary voltage U1. Cases in which no power can be transmitted to the secondary side occur, for example, when there is no or only a poor coupling between the GPM 105 and the CPM 104, thus when $k \to 0$ or, if the output resistance is low, for example, in the case of an output short-circuit, thus when $R_O \to 0$ applies. Should such a state exist in which no power can be transmitted to the secondary side, it also applies that the amounts $\|GUinU1(s)\|2$ and $\|GUinI1(s)\|2$ are very large. In other words, this means that with a small duty cycle (and thus a small input voltage Uin) both a very high RMS (root mean square) value in the rms value of the current I1 and in the voltage U1 is achieved, resulting in a very high S1.

The regulating device 302 must monitor the control voltage U1 and the control current I1 by means of the measuring device 301. This state, in which no power can be transmitted to the secondary side, must not be operated for a long time, in particular in the event of an output short circuit, in particular in the event that $R_O=0$. Overcurrent monitoring is provided in the system 100 to detect such a state. If a short circuit occurs with low activation, this protective function is bypassed and hardware of the CPM 104 may be damaged.

In order to be able to carry out a calibration before the start-up phase S702, the sinusoidal signals at the output of the filter 200 are measured by means of the measuring device 301, when the harmonics generated by the square-wave signal of the generator 201 have substantially been removed by means of the filter 200. The measuring device 301 represents the sinusoidal measuring signals in the time domain. This illustration in the time domain substantially only serves to describe the dependency of the measurement with the phase shifts between the current I1 and the voltage U1. In the time domain, a phase shift becomes noticeable as a dead time.

$$U_{mess}(t)=U_{rms}\sqrt{2}\sin(\omega t+\phi_{U,mess}), \phi_{U,mess}>0 \quad (K4)$$

$$I_{mess}(O)=I_{rms}\sqrt{2}\sin(t+(\omega t+\phi_{I,mess}+\phi_{UI}), \phi_{I,mess}>0 \quad (K5)$$

In other words, this means that due to the measurement there is a phase error or an incorrectly determined phase shift between the real voltage U1 and the measured voltage $U_{mess}$ or between the real current I1 and the measured current. A phase shift $\phi_{U,mess}$ or $\phi_{I,mess}$, which does not exist in reality, is observed solely by the measuring device 301 and the different influencing factors on the measuring device 301. The phase shift between current and voltage which is caused by the filter 200 is $\phi_{UI}$.

The phase shift $\phi_{UI}$ between $U1(t)=U_{rms}\sqrt{2}\sin(\omega t)$ and $I1(t)=I_{rms}\sqrt{2}\sin(\omega t+\phi_{UI})$ can be determined, assuming that no measurement error $\phi_{U,mess}, \phi_{I,mess}, \phi_{Fehler}$ is present, by means of the measuring device 301 using two different methods. The measuring device can determine the phase difference of the current I1 and of the voltage U1 by means of the O-passage detection or the zero-passage detection with an analog measuring method, in that the measuring device 301 determines the times of the zero crossings of I1 and U1 and from this determines the phase shift as the time difference between the zero crossings. Alternatively or additionally, the measuring device 301 can calculate the phase difference between U1 and I1 from the ratio of a continuous real power measurement and an apparent power measurement as $\cos(\phi_{mess})$, cf. formula (K3). In other words, the real power P and the apparent power S are measured and from this the value for $\cos(\phi_{mess})$ is determined. This can be resolved after the phase and a value for the phase $\phi$mess is obtained.

However, when a measurement is actually carried out with the measuring device 301, there will be a measurement error of the phase compared to the actual phase position. This measurement error occurs in the form of $\phi_{U,mess}, \phi_{I,mess}, \phi_{Fehler}$. Regardless of the selection of the measuring system 301 or the measuring device 301, the phase position is falsified when the phase position is detected $\phi_{U,mess}, \phi_{I,mess}, \phi_{Fehler}$ due to the influence of digital filtering, due to influencing factors of analog measurement technology, such as component scatter or component tolerance, due to influencing factors of the system configuration and/or other influencing factors such as temperature, and aging effects.

So if $\phi_{mess}$ is measured, this value is made up of the actual phase shift $\phi_{UI}$ between current and voltage, the phase error $\phi_{I,mess}$ between the actual phase of the current and the measured phase of the current, the phase error $\phi_{U,mess}$ between the actual phase of the voltage and the measured phase of the voltage and an error $\phi_{Fehler}$ in the phase position detection. This results in the value for the measured phase position $$\phi_{mess}=\phi_{UI}+(\phi_{I,mess}-\phi_{U,mess})+\phi_{Fehler}. \quad (K6)$$

To achieve this goal $(\phi_{I,mess}-\phi_{U,mess})+\phi_{Fehler}=0$, i.e., compensating for the overall error over $\phi_{I,mess}$ and $\phi_{U,mess}$ some of the influences that lead to an incorrect phase measurement can be counteracted. For example, the influence of the digital filtering can be removed substantially deterministically, for example, by using a correction filter. The influencing factors of analog measurement technology can be estimated and thus removed, but they are subject to stochastic scattering and can therefore not be removed as effectively as the influencing factors of digital filtering. The influencing factors of the system configuration, for example, impedance changes in the case of changes in Cb that are not intentionally brought about, but also changes in L1, are difficult to remove because impedances change with different system configurations. The low-pass characteristics of the measuring circuit, the capacitance Cb of the filter 200 and also the inductance L1 may change as a result of temperature and aging. These influencing factors of the system configuration can differ from the ICS system 100 to the ICS system 100, even if the ICS systems 100 are of the same type. However, these influencing factors of the system configuration can be largely eliminated by means of calibration measures. Regardless of the source of the error, the total error is corrected using known system relationships.

These influences are estimated and are characterized in a device-independent constant "default calibration value phase position" $\phi$cal. There is a default value as a reference that is the same for all systems 100. The systems 100 calibrate themselves at each start of charging in the calibration phase S602 using the method mentioned, specifically recursively, i.e., always based on the last set calibration value from the last charge cycle S603.

Due to the errors in the determination of the phase position, one cannot be sure whether the values with which the measuring device 301 and the control device 302 work also correspond to the actual values, and this both in the phases of the startup process S702, S703 and also the subsequent transmission power control in phase S705, i.e., during the inductive charging phase S603. The prefixing of the calibration phase S602 can therefore allow for precise inductive charging since it substantially helps to avoid measurement errors.

Figure 11:
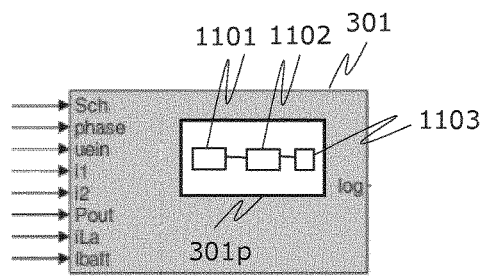
FIG. 11 is a detailed view of the measuring device with the primary measuring device according to one embodiment of the present invention.

FIG. 11 is a detailed view of the measuring device 301 with the primary measuring device 301p or primary measuring device 301p according to one embodiment of the present invention.

The primary measuring device 301p for measuring a current real power P, P1 in a primary circuit 202 of a power transmission system 100 has an evaluation device 1101 and a calibration device 1102. The evaluation device 1101 has a measuring connection for detecting a current $I1_{mess}$, a voltage $U1_{mess}$, and a measured phase shift $\phi_{mess}$ between the current $I1_{mess}$ and the voltage $U1_{mess}$ in the primary circuit 202. The current $I1_{mess}$ is measured via the input i1 of the measuring device 301. And the evaluation device 1101 and the calibration device 1102 are connected to one another and the evaluation device 1101 is also configured to carry out a power measurement by evaluating the detected current $I_{mess}$ and the detected voltage $U_{mess}$. The calibration device 1102 is also configured to correct the detected current $I_{mess}$ and/or the detected voltage $U_{mess}$ via the cos( ) value of the detected phase shift $\phi_{mess}$ between the detected current $I_{mess}$ and the detected voltage $U_{mess}$. The evaluation device 1101 is configured to calculate a power value with the corrected value $I_{korr}$ of the detected current and/or with the corrected value $U_{korr}$ of the detected voltage, and the calibration device 1102 is configured to provide the calculated power value as the current real power $P_{korr}$. $P_{korr}$ results from $\phi_{korr}$. If the phase is corrected, then the power is corrected; $P_{korr}=I_{rms}*U_{rms}*\phi_{korr}$ The voltage $U(t)$ and the current $I(t)$, in particular $U1(t)$ and $I1(t)$ in the primary circuit 202, are sampled at a high sampling rate of, for example, 1 MHz. The frequencies of the signals $U(t)$ and $I(t)$ are in a permissible range between 81.35 kHz to 90 kHz, the permissible frequency band for ICS systems. The phase shift $\phi_{mess}$ is determined according to formula (K3) from $$\cos(\phi) = \frac{P}{S}.$$

This phase shift $\phi_{mess}$ includes all phase shifts of the system, namely the phase shift between real and measured voltage $\phi_{U,mess}$, the phase shift between real and measured current $\phi_{I,mess}$, and the actual phase shift between the current and the voltage $\phi_{UI}$. These phase shifts are delays caused by the hardware of the ICS system 100, in particular delays caused by the digital and analog assemblies (analog and digital group delays) of the ICS system 100. The measured power $P_{mess}$ depends on these group delays and is falsified by the group delays. This falsification is to be corrected by the calibration device 1102. With the group delays, $\phi$ and thus P are also corrected.

The primary measuring device 301p calculates the corrected value $I_{korr}$ of the detected current from the detected value of the current $I_{mess}$ taking into consideration a delay value $T_{CAL}$, which was derived from the detected phase shift $\phi_{mess}$.

$\phi_{mess}$ is the measured phase shift between the measured current $I_{mess}$ and the measured voltage $U_{mess}$ in the primary circuit 202.

$$I_{korr} = I_{mess} - \frac{\Delta T_{PhaseShift}}{50 \text{ ns}} \quad (K7)$$

$$\Delta T_{PhaseShift} = \left(\cos^{-1}(\cos\phi) - \frac{\pi}{2}\right) * \frac{11.11 \text{ µs}}{2\pi} \quad (K8)$$

$\Delta T_{PhaseShift}$ is added iteratively to $T_{cal}$, i.e. $Tcal_k = \Delta T_{PhaseShift} + T_{cal,k-1}$.

This principle ensures a calibration of the power at low power. The deviations can be greater for high power. However, the regulation of the small powers is more difficult in an ICS system 100, it being necessary to determine whether a working point has been found and the minimum power at the output side 220 has to be regulated.

In the equations (K7) and (K8), boundary conditions are selected which characterize the system embodiment of the ICS system 100, A calibration, i.e., the determination and consideration of a delay value $T_{CAL}$ of a phase shift, can be carried out at each frequency of the allowable frequency range between 81.35 kHz up 90 kHz. In one example, to determine the value of the calibration by means of controller 302, a working point of the ICS system 100 is set at which the effective power is very much smaller than the apparent power, in which P<<S, in particular P1<<S1, applies. At this specific working point, the cosine value of the phase shift is zero $$\cos(\phi) = \frac{P}{S} = 0,$$

so that it can be assumed that the detected measured values $I_{mess}$, $U_{mess}$ also correspond to the real measured values.

It can thus be viewed as an idea of calibration to compensate for all phase rotations or phase shifts that occur within a measured $\cos(\phi_{mess})$ by adding a group delay to a measured value of I or to a measured value of U in order to compensate for the incorrect phase rotation. A sample-hold device 1103 is provided in a digital part of the measuring device 301 for this compensation.

This calibration can be carried out for a setpoint value provided by a power controller 302. In other words, the controller 302 can be given a setpoint $P_{soll}$ by the setpoint value setting device 304 by already taking the calibration into consideration. Alternatively, however, the measured value in the measuring device can also be corrected by means of the calibration, so that the target value specification device 304 can work with real values and does not have to take any phase errors into consideration.

The sample-hold device 1103 of the primary measuring device 301p can be configured to take into consideration the delay value $T_{CAL}$ in order to compensate for the incorrect phase rotation in a measurement signal.

The sample-and-hold device 1103 can take into consideration a runtime in the hardware of the primary measuring device 301p, i.e., a runtime that arises from the runtime of a signal through the hardware of the primary measuring device 301p. The phase shifts arise due to the measurement technology, in particular, due to the transit time through the measurement modules of the primary measuring device 301p. These phase shifts are converted into a group delay and provided as a calibration value in the form of a group delay. The total group delay Tcal or the total phase shift φcal of the measured signal to the real signal includes a systematic phase shift due to the circuit design, e.g., transformers and additional system corrections.

Figure 12:
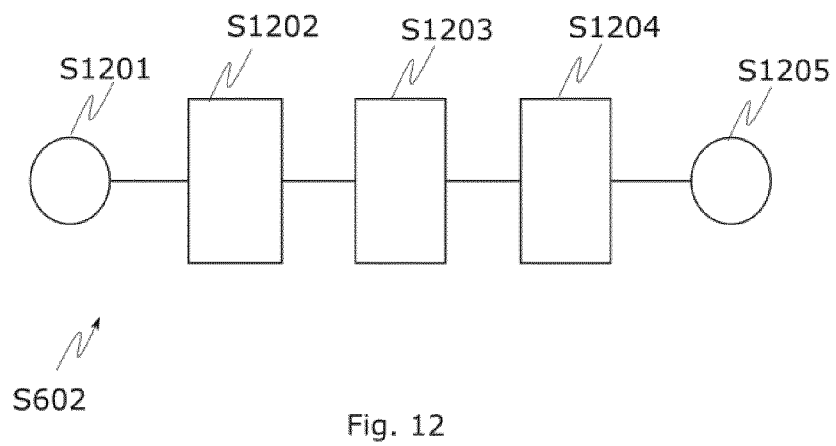
FIG. 12 is a flow diagram of a method for determining a calibration factor for a measurement of a real power in a primary circuit of a power transmission system according to one embodiment of the present invention.

The primary measuring device 301p can be integrated in a ground pad module 105. The GPM 105 works as an autonomous system and can perform the calibration without a CPM 103. Alternatively, however, it is also possible to cooperate with a CPM 103 to determine a calibration value. The components of the measuring device 301 that are used for the calibration are available on the GPM 105. The calibration is based only on primary-side measurements of the measured variables that are available on the primary side, P1, S1, I1, U1. The variables R0 and Pout are not used by the calibration, they are only used to illustrate the calibration process FIG. 12 is a flow diagram of a method for determining a calibration factor for a measurement of a real power in a primary circuit 202 of a power transmission system 100 according to one embodiment of the present invention. This method is substantially carried out for each charging process before charging is started in order to determine the calibration factor. The calibration factor is found in the calibration phase S602 of a charging process. A switch can also be provided with which the execution of the calibration phase S602 can be switched off and on.

The method for determining a calibration factor for a measurement of a real power in a primary circuit 202 of a power transmission system 100 starts in an idle state S1201. In the state S1202, it provides for the adjusting of a predefinable working point by setting a predefinable input voltage and a predefinable working frequency. In the state S1203, the method also includes generating a power ratio with a low real power and a high apparent power at this working point. Before the method ends in the idle state S1205, the calibration factor is determined as a phase shift $\phi_{cal}$ in state S1204 and/or as holding time Tcal. This calibration factor can then be taken into consideration in the subsequent loading phase S603 of the ICS system in order to compensate for measurement errors.

Figure 13:
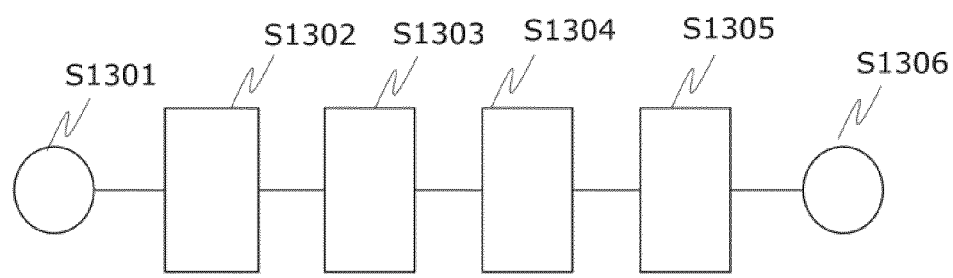
FIG. 13 is a flow diagram of a method for calibrating a measured value according to one embodiment of the present invention.

FIG. 13 is a flow diagram of a method for calibrating a measured value according to one embodiment of the present invention. This method can be used to use a calibration factor during a subsequent measurement phase, for example, in the subsequent loading phase S603, in order to eliminate measurement errors. When the calibration factor is adjusted, it can be taken into consideration during all subsequent measurements. In this way, a GPM 105 and/or an ICS system 100 can be calibrated.

The method for calibrating a measured value begins in the idle state S1301. In the subsequent state S1302, a current $I_{mess}$, a voltage $U_{mess}$, and a measured phase shift $\phi_{mess}$ are detected between the current $I_{mess}$ and the voltage $U_{mess}$ in a primary circuit 202. In state S1303, a power measurement is carried out by evaluating the detected current $I_{mess}$ and the detected voltage $U_{mess}$. In state S1304, the detected current $I_{mess}$ and/or the detected voltage $U_{mess}$ are corrected using the cos ( ) value of the detected phase shift $\phi_{mess}$ between the detected current $I_{mess}$ and the detected voltage $U_{mess}$ and/or over a holding time $T_{cal}$ and the calculation of a power value with the corrected value $I_{korr}$ of the detected current and/or the corrected value $U_{korr}$ f the detected voltage. In the state S1305, the calculated power value is provided as current real power $P_{korr}$ before the method ends in idle state S1306.

The calibration of the power is determined with the help of the detection of the calibration factor in the form of the phase position at a working point with the following basic procedure.

A predefined input voltage and a working frequency are adjusted by means of the regulating device 302. For this purpose, a feedforward control without feedback loop 101 is used. In other words, with a feedforward control without a feedback loop, the control curves PWM x/y 1401, 1402 are set using the parameters of the phase shift from x to y and a common PWM frequency, i.e., the same frequency for PWMx/y is carried out with 50% PWM-X duty cycle and 50% PWM-Y duty cycle, as shown in FIG. 14 by signals 1401 1402. The frequency and the phase are set, controlled, or varied until a minimum power can be measured at the input 206 of the filter for the regulation. This results in the profile of the input voltage $U_{ein}$ 1403 or $U_{in}$.

This may mean that the GPM 105 can work independently for this purpose without a CPM 104 being required. It is therefore sufficient to adjust the predefined input voltage and a working frequency to define the GPM 105 locally by means of the regulating device 302 without having to take into consideration any influence of the CPM 104.

The effective power of the primary circuit 202 is then adjusted by means of the control device 302 so that the effective power is low or in the range of 0 W with a significantly larger apparent power compared to the reactive power, so that P<<S applies. This large difference between apparent power and reactive power can, with the inclusion of the CPM 104, also be adjusted independently of the GPM 105 solely through a system configuration of the GPM 105.

The setting of the property which applies in the primary circuit 202 of the GPM 105 that P<<S can be achieved using the CPM in that the CPM 104 adjusts a state in which the load 205, i.e., $R_O$ or $R_{Last}$ is minimized, so that $R_{Last} \rightarrow 0\Omega$ applies.

To minimize the load on the CPM 104, the CPM 104 can short-circuit the load 205 on the secondary side, so that $R_0=0$ applies, in particular so that the impedance $Z_O$ is a real load and it approaches zero. A short circuit of the load 205 can be brought about by means of the crowbar 401 present in the CPM 104, which has the switch S1. If the crowbar 401 is blocked, i.e., S1 is closed, the load at the output of the CPM 104 is substantially short-circuited and is close to zero. If no real power P2 can flow on the secondary side 203, then the power in the primary circuit 202 is P1=0 for any apparent power S1. In addition, the current I and voltage U in the primary circuit are phase shifted by 90°. This method of reducing the real power compared to the apparent power so that P<<S applies, taking into account the CPM 104, is independent of the properties of the oscillating circuit 211 and its parameters k, L1, L2, and the voltages $U_{ein}$ or $U_{in}$ at the input of the filter 200 and U1 or $U_{Batt}$ of the system 100.

Adjusting the property, that in the primary circuit 202 of the GPM 105 P<<S applies: this can alternatively also be achieved substantially without having to create settings on the CPM 104 by making a specific system configuration in the GPM 105. For this purpose, the control device 302 sets a phase shift between the signals PWMx 1401 and PWMy 1402 of the PWM generator 201, which results in a duty cycle of the resulting PWM signal 1403, so that an input voltage Uein or $U_{in}$ set, but no real power builds up yet. The input voltage is only set by the phase shift and by the duty cycle of the resulting PWM signal. The frequency adjustment ensures a high apparent power to real power. The system is adjusted at a frequency which is well above the resonance frequency. This shift results in a high apparent power to real power.

The system, in particular the GPM 105, needs a very high proportion of reactive power at very low power levels where P$\rightarrow$0 or P<<S can be assumed. This is due to the system as a result of the control of this converter in the ICS topology, according to FIG. 4. A low power is provided at a high frequency.

A working point is determined by the input voltage $Ue_{in}$ or $U_{in}$ and the frequency. This working point is to be selected in a system-specific or configuration-specific manner. For this purpose, the CPM current (battery current) can be used as a feedback source.

Since the charging process in an ICS system is only started after the coupling of the CPM and the GPM, another option to meet P<<S is not implemented. This method provides for the manipulation of the resonant circuit, the oscillating circuit being manipulated in such a way that the couple factor k becomes very small and that k→0 applies. In order to carry out this manipulation, the position from the CPM to the GPM would not have to be defined by the vehicle and would have to be able to be influenced during charging It would be a conceivable application for other systems. For example, the CPM could be moved far away from the GPM by a moving system and a current could be set in the GPM.

The coupling decreases with the distance in height (z-distance) from coil to coil. This could be used for systems that can control the car and are only allowed to set up a field when a car is above the charging component and no field structure without CPM requirement is permitted for functional safety.

When setting a working point with a specific setting voltage Uin and an activation frequency fSw the following relationship arises for the calibration value of the phase position φcal:

$$\phi_{cal} = \frac{\pi}{2} - \phi_{mess} - \phi_{cal}, DEF \quad (K9)$$

As stated above, the phase shift can be determined analogously as a time value or as a zero crossing detection of current and voltage or as $$\cos(\phi) = \frac{P}{S}$$

with a continuous active and apparent power measurement according to formula (K3). The phase shift φcal can be added to a zero crossing detection measurement. When the real power is detected using continuous measurement, a group delay can be controlled dynamically with a holding time Tcal. A dynamic group delay is determined by the holding time. The holding time Tcal has been calculated at a specific working frequency, for example, at the starting frequency fstart=90 kHz. Since the phase is to be corrected, the time must be corrected with the current control frequency. The calculation below shows the calculation of the correction. However, a system does not necessarily have to have this corrective measure, since a constant value of Tcal (f=90 kHz) can be expected. If the correction is provided, the measurement can be made more accurate.

In other words, depending on the method used for the phase shift measurement, the calibration factor Tcal or φcal can be determined:

$$T_{CAL}(i_{mess}(t)) = \phi_{cal}\frac{f_{sw}}{2\pi}, T_{CAL}(u_{mess}(t)) = 0; \quad \phi_{cal} \geq 0 \quad (K10)$$

$$T_{CAL}(u_{mess}(t)) = \phi_{cal}\frac{f_{sw}}{2\pi}, T_{CAL}(i_{mess}(t)) = 0; \quad \phi_{cal} \geq 0 \quad (K11)$$

In the formulas (K10), (K11), the values related to the phase shift are 0. In (K10), the voltage is the reference for the phase difference of the current, and in (K11), the current is the reference for the phase difference of the voltage.

To determine the individual measured values in the ICS system 100 and, in particular, in the GPM 105, the GPM signals or transformer signals U1 and I1 are scanned by means of the measuring device 301. In one example, the measuring device 301 uses a sampling rate of 1 MHz to sample the transformer signals. This sampling rate is sufficient for signals with 80 kHz-90 kHz.

Through instantaneous value detection, the measuring device 301 detects the transformer signals U1 and I1 of the primary circuit 202 and calculates the real power P1 therefrom. The real power is calculated with the instantaneous value detection by $$P = \frac{1}{T}\int_0^T u(t + T_{CAL}(u)) * i(t + T_{CAL}(i)) \quad (K12)$$

The previously determined calibration factor Tcal is taken into consideration in this case in order to eliminate measurement errors when calculating the power. Sample and hold or simple addition is used for calibration. The addition of Tcal is mathematically shown in (K12). The apparent power is independent of time or angle. The phase shift is not relevant, as can be seen from (K13).

The apparent power results from:

$$S = \frac{1}{T}\sqrt{\int_0^T u^2(t) \cdot \int_0^T i^2(t)} = U \cdot I \quad (K13)$$

As already stated, the adjusting of a large difference between the effective power and the apparent power is provided P<<S for determining a calibration factor for the power measurement. This large difference between apparent power and reactive power can, with the inclusion of the CPM 104, also be adjusted independently of the GPM 105 solely through a system configuration of the GPM 105.

In the variant in which the CPM 104 of a vehicle is included, a short circuit is generated on the CPM. For the adjusting of the short circuit, the CPM 104 communicates with the GPM 105 via the channel 101. The CPM signals to the GPM that the CPM wants to be charged. In another example, the GPM 105 could also start the charging process.

This signaling can trigger the charging process by transmitting power from the GPM to the CPM. To start charging, the CPM can transmit a charging command to the GPM. The CPM 104 keeps the crowbar in the "crowbar closed" state after the charging command has been sent, in which the switch S1 is closed in order to separate the battery 205 and/or the intermediate circuit 205 from the vehicle from the secondary oscillating circuit 203 by means of a short circuit. This state is also sent to the GPM 105 via the communication interface 101. Since the GPM has not yet loaded, it still reports a state "calibration pending," during which the GPM 105 is calibrated.

The GPM uses a feedforward device on the controller 302 to build up a working point at a defined input voltage Uin, with a defined working frequency fsw,cal and to build up an apparent power S at this working point. In this case, cal in the index means the control frequency at which the calibration is carried out, e.g., 90 kHz.

The CPM 104 is informed by means of a corresponding signal from the GPM 105 via channel 101 that the calibration of the real power has been completed, i.e., that the determination of the calibration factor and the adjusting of the corrective measures in the measuring device 301 have taken place. After receiving this ready message, the CPM 104 opens the crowbar 401 and changes to the "crowbar open" state and signals back to the GPM that the crowbar 401 is open.

The determined delay times or calibration factors can then be adapted as a function of the control frequency fsw or working frequency fsw of the GPM $$T_{CAL,DYN} = T_{CAL} \frac{f_{sw,CAL}}{f_{sw}} \quad (K17)$$

The GPM 105 thus concludes the calibration phase S602 and goes into the charging mode S603. During the charging operation S603, the GPM 105 adjusts the real power P1 of the ICS system 100 based on the measurement with the additional delays Tcal(i) and Tcal(u) determined.

In the variant in which a system configuration or a system analysis is carried out in order to carry out a calibration, the control of the crowbar into the short circuit is not carried out or is omitted. The crowbar thus remains inoperative during this calibration process. However, since the crowbar is not activated, the state P<<S has to be established in another way.

The relevant transmission functions are determined for all operating states of the device. A search is made for the maximum control voltage $U_{ein,max}$ at which in over-resonant operation (fsw=fsw$_1$) less than 50 W can be transmitted from the GPM 105 to the CPM 104, taking into consideration all coupling values k, all inductance values, and output voltage values $U_{Batt}$, which are defined by $Z_0$. As a result, the condition P<<S is approximated. Thus, indirectly, the real component of the equivalent impedance $Z_0$ is also so small that this behavior can be equated with a short circuit of the crowbar and a method similar to the variant in which the CPM and in particular the crowbar is also used to carry out the calibration can be carried out. The inductance values L1, L2 can vary in a parking position, for example. These specifications can be taken into consideration when dimensioning and designing the ICS system. The phase shift and control frequency of the calibration are chosen so that these parameter combinations lead to a very small P1/S1 ratio for all parking positions and battery voltages.

In addition, it should be pointed out that "comprising", "including", and "having" do not exclude any other elements or steps and that "a" or "an" does not exclude a plurality. It should also be noted that features or steps that have been described with reference to one of the above embodiments can also be used in combination with other features or steps of other embodiments described above. Reference signs in the claims are not to be regarded as a limitation.

The invention claimed is:

1. A ground pad module with a primary measuring device for measuring a current real power in a primary circuit of a power transmission system, wherein the primary measuring device comprises:
   an evaluation device; and
   a calibration device;
      wherein the evaluation device includes a measuring connection for detecting a current ($I_{mess}$), a voltage ($U_{mess}$), and a phase shift ($\phi_{mess}$) between the current ($I_{mess}$) and the voltage ($U_{mess}$) in the primary circuit;
      wherein the evaluation device and the calibration device are connected to one another, and the evaluation device is also configured to carry out a power measurement by evaluating the detected current ($I_{mess}$) and the detected voltage ($U_{mess}$);
      wherein the calibration device is configured to correct the detected current ($I_{mess}$) and/or the detected voltage ($U_{mess}$) via a cosine value of the detected phase shift ($\phi_{mess}$) between the detected current ($I_{mess}$) and the detected voltage ($U_{mess}$) and/or via a holding time (Tcal) to generate a corrected value ($I_{korr}$) of the detected current and/or a corrected value ($U_{korr}$) of the detected voltage;
      wherein the evaluation device is configured to calculate a power value with the corrected value ($I_{korr}$) of the detected current and/or with the corrected value ($U_{korr}$) of the detected voltage; and
      wherein the calibration device is configured to provide the calculated power value as a current real power ($P_{korr}$).

2. The ground pad module according to claim 1, wherein the corrected value of the detected current ($I_{korr}$) is obtained from a detected value of the current ($I_{mess}$) taking into account a delay value ($T_{CAL}$), the delay value ($T_{CAL}$) derived from the phase shift ($\phi_{mess}$).

3. The ground pad module according to claim 1, wherein the calibration is carried out for a provided setpoint value of a power control.

4. The ground pad module according to claim 2, further comprising a sample-and-hold device set up to take account of the delay value ($T_{CAL}$).

5. The ground pad module of claim 4, wherein the sample-and-hold device takes into account a running time in a hardware of the primary measuring device.

6. A method of determining a calibration factor for a measurement of an effective power in a primary circuit of a power transmission system, the method comprising:
   setting a predefinable working point by setting a predefinable input voltage and a predefinable working frequency;
   at the working point, generating a power ratio with a low effective power and a high apparent power; and
   determining the calibration factor as a cosine value of a phase shift ($\phi_{cal}$) and/or as a holding time (Tcal) for a known reference ($\phi_{ref}$).

7. A method of calibrating a measured value, the method comprising:
   detecting a current ($I_{mess}$), a voltage ($U_{mess}$), and a phase shift ($\phi_{mess}$) between the current ($I_{mess}$) and the voltage ($U_{mess}$) in a primary circuit;
   carrying out a power measurement by evaluating the detected current ($I_{mess}$) and the detected voltage ($U_{mess}$);
   correcting the detected current ($I_{mess}$) and/or the detected voltage ($U_{mess}$) via a cosine value of the detected phase shift ($\phi_{mess}$) between the detected current ($I_{mess}$) and the detected voltage ($U_{mess}$) and/or a holding time (Tcal) to generate a corrected value ($I_{korr}$) of the detected current and/or a corrected value ($U_{korr}$) of the detected voltage;

calculating a power value with the corrected value ($I_{korr}$) of the detected current and/or with the corrected value ($U_{korr}$) of the detected voltage; and provisioning the calculated power value as a current effective power ($P_{korr}$).

8. A computer-readable storage medium storing instructions that, when executed by a processor, cause the processor to perform operations of the method according to claim 6.

9. A computer-readable storage medium storing instructions that, when executed by a processor, cause the processor to perform operations of the method according to claim 7.

* * * * *